United States Patent
Yamazaki et al.

(10) Patent No.: US 8,394,655 B2
(45) Date of Patent: Mar. 12, 2013

(54) PHOTOELECTRIC CONVERSION DEVICE AND METHOD FOR MANUFACTURING THE SAME

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 669 days.

(21) Appl. No.: 12/264,541

(22) Filed: Nov. 4, 2008

(65) Prior Publication Data
US 2009/0120498 A1      May 14, 2009

(30) Foreign Application Priority Data
Nov. 9, 2007 (JP) .................................. 2007-292650

(51) Int. Cl.
*H01L 21/00* (2006.01)
(52) U.S. Cl. ...... 438/45; 438/34; 438/458; 257/E21.568
(58) Field of Classification Search .................... 438/45, 438/34, 96, 455, 458, 459
See application file for complete search history.

(56) References Cited

U.S. PATENT DOCUMENTS

| | | | |
|---|---|---|---|
| 4,180,618 A | 12/1979 | Alpha et al. | |
| 4,496,788 A | 1/1985 | Hamakawa et al. | |
| 4,633,034 A | 12/1986 | Nath et al. | |
| 4,665,277 A | 5/1987 | Sah et al. | |
| 4,926,229 A | 5/1990 | Nakagawa et al. | |
| 4,959,106 A | 9/1990 | Nakagawa et al. | |
| 5,002,617 A | 3/1991 | Kanai et al. | |
| 5,002,618 A | 3/1991 | Kanai et al. | |
| 5,006,180 A | 4/1991 | Kanai et al. | |
| 5,024,706 A | 6/1991 | Kanai et al. | |
| 5,259,891 A | 11/1993 | Matsuyama et al. | |
| 5,328,519 A | 7/1994 | Kawakami | |
| 5,417,770 A | 5/1995 | Saitoh et al. | |
| 5,439,533 A | 8/1995 | Saito et al. | |
| 5,527,396 A | 6/1996 | Saitoh et al. | |

(Continued)

FOREIGN PATENT DOCUMENTS

| | | |
|---|---|---|
| EP | 1 088 913 | 4/2001 |
| EP | 1505174 A | 2/2005 |

(Continued)

OTHER PUBLICATIONS

International Search Report (Application No. PCT/JP2008/069992) Dated Jan. 27, 2009.

(Continued)

*Primary Examiner* — Charles Garber
*Assistant Examiner* — Reema Patel
(74) *Attorney, Agent, or Firm* — Eric J. Robinson; Robinson Intellectual Property Law Office, P.C.

(57) ABSTRACT

A photoelectric conversion device with an excellent photoelectric conversion characteristic with a silicon semiconductor material effectively utilized. The photoelectric conversion device includes a first unit cell including a first electrode, a first impurity semiconductor layer, a single crystal semiconductor layer, and a second impurity semiconductor layer; and a second unit cell including a third impurity semiconductor layer, a non-single-crystal semiconductor layer, a fourth impurity semiconductor layer, and a second electrode. The second and third impurity semiconductor layers are in contact with each other so that the first and second unit cells are connected in series, and an insulating layer is provided for a surface of the first electrode and bonded to a supporting substrate.

13 Claims, 18 Drawing Sheets

U.S. PATENT DOCUMENTS

| | | | |
|---|---|---|---|
| 5,571,749 A | 11/1996 | Matsuda et al. | |
| 5,635,408 A | 6/1997 | Sano et al. | |
| 5,665,607 A | 9/1997 | Kawama et al. | |
| 5,676,765 A | 10/1997 | Saito et al. | |
| 5,736,431 A | 4/1998 | Shinohara et al. | |
| 5,811,348 A | 9/1998 | Matsushita et al. | |
| 6,100,465 A | 8/2000 | Shinohara et al. | |
| 6,190,937 B1 | 2/2001 | Nakagawa et al. | |
| 6,331,208 B1 | 12/2001 | Nishida et al. | |
| 6,468,884 B2 | 10/2002 | Miyake et al. | |
| 6,486,041 B2 | 11/2002 | Henley et al. | |
| 6,566,277 B1 | 5/2003 | Nakagawa et al. | |
| 6,692,981 B2 | 2/2004 | Takato et al. | |
| 6,756,289 B1 | 6/2004 | Nakagawa et al. | |
| 6,818,529 B2 | 11/2004 | Bachrach et al. | |
| 6,835,888 B2 * | 12/2004 | Sano et al. | 136/249 |
| 6,951,689 B1 | 10/2005 | Higashikawa | |
| 7,759,220 B2 | 7/2010 | Henley | |
| 2005/0022864 A1 | 2/2005 | Fujioka et al. | |
| 2006/0065299 A1 | 3/2006 | Fukawa et al. | |
| 2007/0193622 A1 | 8/2007 | Sai | |
| 2008/0245406 A1 | 10/2008 | Yamazaki et al. | |
| 2008/0251126 A1 | 10/2008 | Yamazaki et al. | |
| 2011/0124151 A1 | 5/2011 | Yamazaki et al. | |

FOREIGN PATENT DOCUMENTS

| | | |
|---|---|---|
| JP | 58-180069 A | 10/1983 |
| JP | 01-227307 | 9/1989 |
| JP | 06-044638 | 6/1994 |
| JP | 07-106617 A | 4/1995 |
| JP | 07-226528 | 8/1995 |
| JP | 08-255762 A | 10/1996 |
| JP | 10-093122 | 4/1998 |
| JP | 10-093122 A | 4/1998 |
| JP | 10-335683 | 12/1998 |
| JP | 11-040832 | 2/1999 |
| JP | 11-274539 A | 10/1999 |
| JP | 2000-150940 * | 5/2000 |
| JP | 2000-294754 | 10/2000 |
| JP | 2001-068709 | 3/2001 |
| JP | 2001-077044 * | 3/2001 |
| JP | 2001-077044 A | 3/2001 |
| JP | 2001-160540 | 6/2001 |
| JP | 2002-100789 | 4/2002 |
| JP | 2002-348198 | 12/2002 |
| JP | 2003-017723 | 1/2003 |
| JP | 2003-017723 A | 1/2003 |
| JP | 2003-324188 | 11/2003 |
| JP | 2004-014958 | 1/2004 |
| JP | 2004-087667 | 3/2004 |
| JP | 2004-296650 A | 10/2004 |
| JP | 2005-050905 | 2/2005 |
| JP | 2005-268682 | 9/2005 |

OTHER PUBLICATIONS

Written Opinion (Application No. PCT/JP2008/069992) Dated Jan. 27, 2009.

* cited by examiner

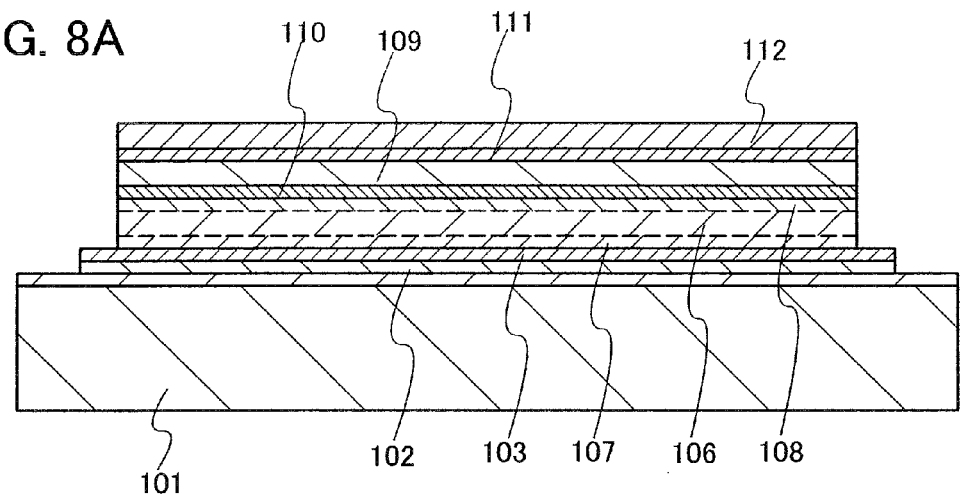
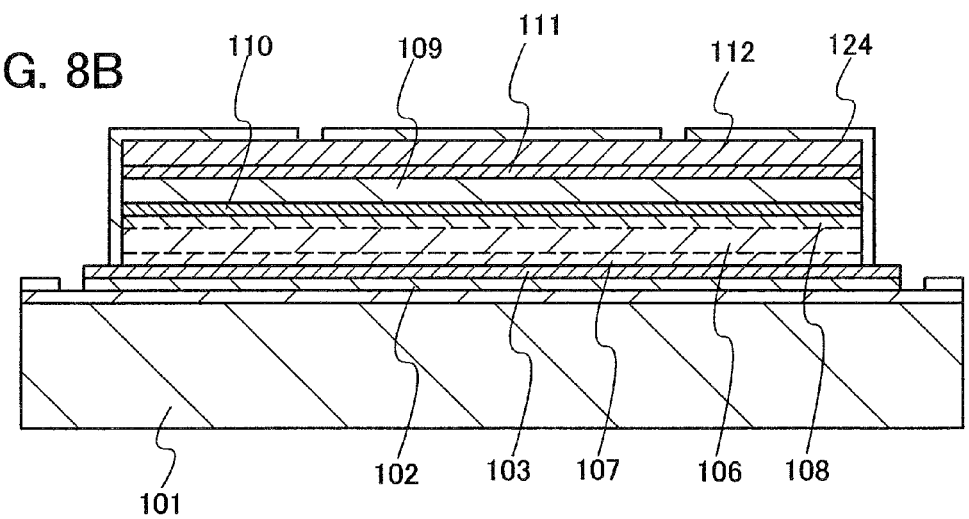
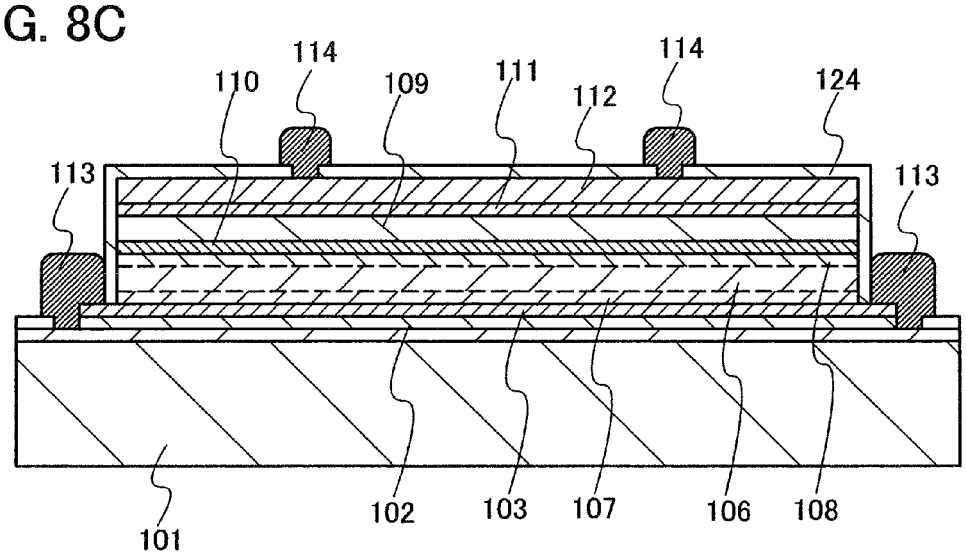

PHOTOELECTRIC CONVERSION DEVICE AND METHOD FOR MANUFACTURING THE SAME

TECHNICAL FIELD

The present invention relates to a photoelectric conversion device using a single crystal semiconductor or a polycrystalline semiconductor, and relates to a so-called tandem photoelectric conversion device in which a plurality of photoelectric conversion elements are stacked.

BACKGROUND ART

As a measure against global warming, solar photovoltaic power generation has become popular in the world. For the solar photovoltaic power generation, a photoelectric conversion device (also called a solar cell) in which light energy is converted into electrical energy by using photoelectric characteristics of a semiconductor is applied in many cases, as compared to the case of utilizing solar heat.

Production of photoelectric conversion devices tends to increase year after year. For example, the total production of solar cells in the world in 2005 was 1,759 MW, which is a drastic increase of 147% as compared to that in the previous fiscal year. Photoelectric conversion devices which have become popular worldwide use a crystalline semiconductor; photoelectric conversion devices using a single crystal silicon substrate or a polycrystalline silicon substrate constitute a large part of the production.

The thickness of a crystal-type photoelectric conversion device using silicon, which is needed to absorb sunlight, is only about 10 μm. Nevertheless, a single crystal silicon substrate or a polycrystalline silicon substrate manufactured as a product has a thickness of about 200 to 300 μm. That is, the photoelectric conversion device using a single crystal semiconductor substrate or a polycrystalline semiconductor substrate has a thickness ten or more times as large as the thickness needed for photoelectric conversion, and thus the single crystal silicon substrate or the polycrystalline silicon substrate is far from being effectively utilized wholly. Speaking of extremes, most part of the single crystal silicon substrate or the polycrystalline silicon substrate functions only as a structural body for keeping the shape of the photoelectric conversion device.

With the increase of production of photoelectric conversion devices year after year, short of supply of polycrystalline silicon, which is the material of a silicon substrate, and resulting rise of cost of the same have become problems of the industry. The production of polycrystalline silicon is expected to be about 36,000 tons in 2007; in contrast, 25,000 tons or more of polycrystalline silicon is needed for semiconductor (LSI) and 20,000 tons or more of polycrystalline silicon is needed for solar cells, which means polycrystalline silicon seems to be in short of supply by about 10,000 tons. This short of supply is predicted to continue.

There are a variety of structures of photoelectric conversion devices. In addition to a photoelectric conversion device having a typical structure in which an n-type or a p-type diffusion layer is formed in a single crystal silicon substrate or a polycrystalline silicon substrate, a stacked photoelectric conversion device in which different kinds of unit cells, i.e., a unit cell formed of a single crystal semiconductor and a unit cell formed of an amorphous semiconductor, are combined is known (see Examined Patent Application Publication No. H6-044638). The photoelectric conversion devices are the same in that a single crystal silicon substrate or a polycrystalline silicon substrate is used. Here, as another mode of a photovoltaic device using a single crystal semiconductor substrate, a photovoltaic device using a single crystal semiconductor layer formed into a slice is given. For example, Patent Document 4 (Patent Document 4: Japanese Published Patent Application No. H10-335683) discloses a tandem solar cell in which hydrogen ions are implanted into a single crystal silicon substrate, a single crystal silicon layer which is separated from the single crystal silicon substrate in a layer shape is disposed over a support substrate in order to lower the cost and save resources while maintaining high conversion efficiency. In this tandem solar cell, a single crystal semiconductor layer and a substrate are bonded to each other with a conductive paste.

On the other hand, photoelectric conversion devices using a crystalline silicon thin film have also been developed. For example, a method for manufacturing a silicon thin-film solar cell in which a crystalline silicon film is deposited over a substrate by a plasma CVD method using a VHF of 27 MHz or higher which has been pulse modulated is described (see Japanese Published Patent Application No. 2005-50905). Further, a technique for controlling plasma process condition to optimize dopant concentration in crystal grains and crystal grain boundaries when a polycrystalline silicon thin film is formed by a plasma CVD method over a special electrode called a texture electrode which has minute unevenness on its surface is disclosed (see Japanese Published Patent Application No. 2004-14958). However, a crystalline thin-film silicon solar cell is still inferior to a single crystal silicon solar cell in crystal quality and photoelectric conversion characteristic. Moreover, a crystalline silicon film needs to be deposited to a thickness of 1 μm or more by a CVD method, which leads to a problem of low productivity.

DISCLOSURE OF INVENTION

Conventionally, it has been difficult to produce photoelectric conversion devices enough to meet the demand, with limited resources effectively utilized. Further, in a method for bonding a single crystal semiconductor layer which is formed into a slice to a support substrate with a conductive paste, there is a problem such that bond strength cannot be maintained for a long time. In particular, in a condition in which a photovoltaic device is exposed to direct sunlight, there is a problem such that an organic material contained in a conductive paste is modified and bond strength is lowered. In addition, there is a problem of reliability such that a conductive material (e.g., silver) in the conductive paste is diffused into the single crystal semiconductor layer, which deteriorates photoelectric conversion characteristics of a semiconductor. In view of such circumstances, it is an object of the present invention to provide a photoelectric conversion device with an excellent photoelectric conversion characteristic with a silicon semiconductor material effectively utilized, and a manufacturing method thereof. It is still another object of the present invention to improve reliability of a photovoltaic device.

According to the summary of the present invention, a photoelectric conversion device includes the following: a first unit cell in which a single crystal semiconductor layer with a thickness of 10 μm or less used as a photoelectric conversion layer and a second unit cell in which a non-single-crystal semiconductor layer provided over the first unit cell used as a photoelectric conversion layer.

One feature of the present invention is a photoelectric conversion device including the following: a first unit cell in which a first electrode is provided for one surface of a single crystal semiconductor layer with a first impurity semiconductor layer having one conductivity type interposed therebetween and a second impurity semiconductor layer having an opposite conductivity type to the one conductivity type is provided for the other surface of the same, and a second unit cell in which a third impurity semiconductor layer having one conductivity type is provided for one surface of a non-single-crystal semiconductor layer and a second electrode is provided for the other surface of the same with a fourth impurity semiconductor layer having an opposite conductivity type to the one conductivity type interposed therebetween. The second impurity semiconductor layer and the third impurity semiconductor layer are in contact with each other so that the first unit cell and the second unit cell are connected in series, and an insulating layer is provided for a surface of the first electrode, which is on the opposite side to the single crystal semiconductor layer, and is bonded to a supporting substrate.

Another feature of the present invention is a method for manufacturing a photoelectric conversion device including the following steps of: introducing cluster ions into a single crystal semiconductor substrate at a depth of 10 μm or less from one surface of the single crystal semiconductor substrate to form a damaged layer; forming a first impurity semiconductor layer, a first electrode, and an insulating layer on the one surface side; bonding the insulating layer to a supporting substrate; cleaving the single crystal semiconductor substrate at the damaged layer, so that a single crystal semiconductor layer remains over the supporting substrate; forming a second impurity semiconductor layer on the cleavage plane side of the single crystal semiconductor layer; decomposing a reactive gas including a semiconductor source gas with an electromagnetic energy, so that a third impurity semiconductor layer having one conductivity type, a non-single-crystal semiconductor layer, and a fourth impurity semiconductor layer having an opposite conductivity type to the one conductivity type are sequentially formed over the second impurity semiconductor layer; and forming a second electrode over the fourth impurity semiconductor layer.

Note that 'single crystals' are crystals in which crystal faces and crystal axes are aligned and atoms or molecules which constitute the single crystals are aligned regularly in terms of space. However, although single crystals are constituted by aligning atoms regularly, single crystals may include a lattice defect in which part of the alignment is disordered, and an intended or unintended lattice distortion.

In accordance with the present invention, a single crystal semiconductor substrate is sliced from the top surface thereof and bonded to a supporting substrate, whereby a photoelectric conversion device in which a top cell is stacked over a bottom cell can be obtained. The bottom cell uses a single crystal semiconductor layer with a thickness of 10 μm or less as a photoelectric conversion layer, and the top cell uses a non-single-crystal semiconductor layer as a photoelectric conversion layer. That is to say, a photoelectric conversion device can be manufactured in which a bottom cell using a single crystal semiconductor layer as a photoelectric conversion layer and a top cell using a non-single-crystal semiconductor layer as a photoelectric conversion layer, which is stacked over the bottom cell, are provided over a large-area glass substrate the upper temperature limit of which is equal to or lower than 700° C. The single crystal semiconductor layer is obtained by separation of an upper portion of the single crystal semiconductor substrate. The single crystal semiconductor substrate which can be repeatedly used enables effective use of resources.

BRIEF DESCRIPTION OF DRAWINGS

FIGS. 8A to 8C are cross-sectional views for describing the process for manufacturing the stacked photoelectric conversion device.

BEST MODE FOR CARRYING OUT THE INVENTION

Figure 1:
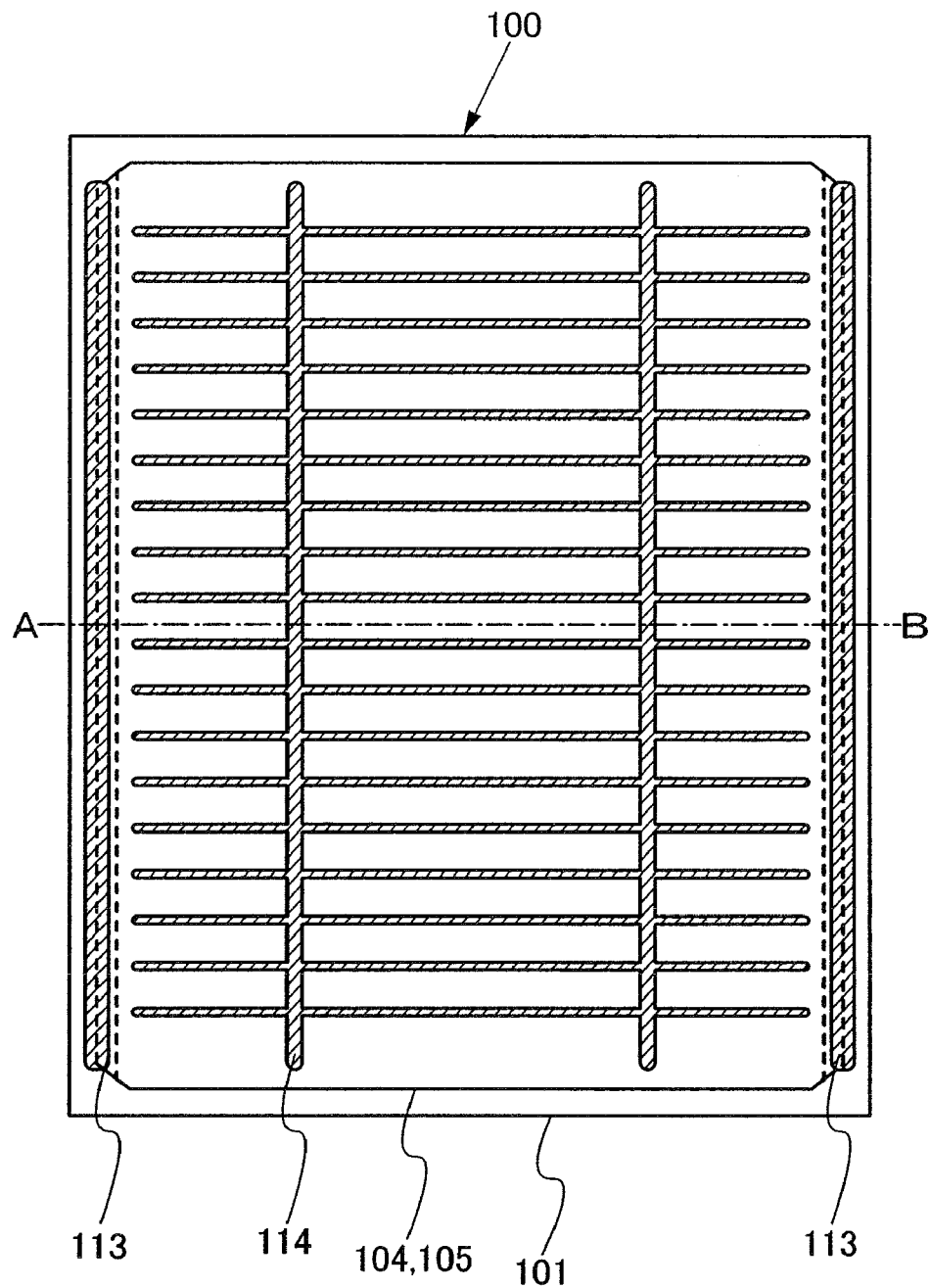
FIG. 1 is a plan view showing a structure of a tandem photoelectric conversion device.

Embodiment modes of the present invention will be explained with reference to the drawings. It is to be noted that the present invention is not limited to the following description, and it is easily understood by those skilled in the art that modes and details thereof can be modified in various ways without departing from the purpose and scope of the present invention. Therefore, the present invention should not be construed as being limited to the description of the following embodiment modes. In the structures of the present invention described below, the same portions are denoted by the same reference numerals through the drawings.

Embodiment Mode 1

FIG. 1 is a plan view of a photoelectric conversion device 100 of this embodiment mode. This photoelectric conversion device 100 includes a first unit cell 104 and a second unit cell 105 which are fixed to a supporting substrate 101. The first unit cell 104 and the second unit cell 105 include semiconductor junction by which photoelectric conversion is performed.

The first unit cell 104 is provided with a first electrode on the supporting substrate 101 side and the second unit cell 105 is provided with a second electrode on the surface side. The first electrode is connected to a first auxiliary electrode 113 and a second auxiliary electrode 114 is provided over the second electrode. The photoelectric conversion device 100 of this embodiment mode has a structure in which the first unit cell 104 and the second unit cell 105 are stacked over the supporting substrate 101 having an insulating surface; therefore, positive and negative electrodes are exposed to the same surface side of the supporting substrate 101.

Figure 2:
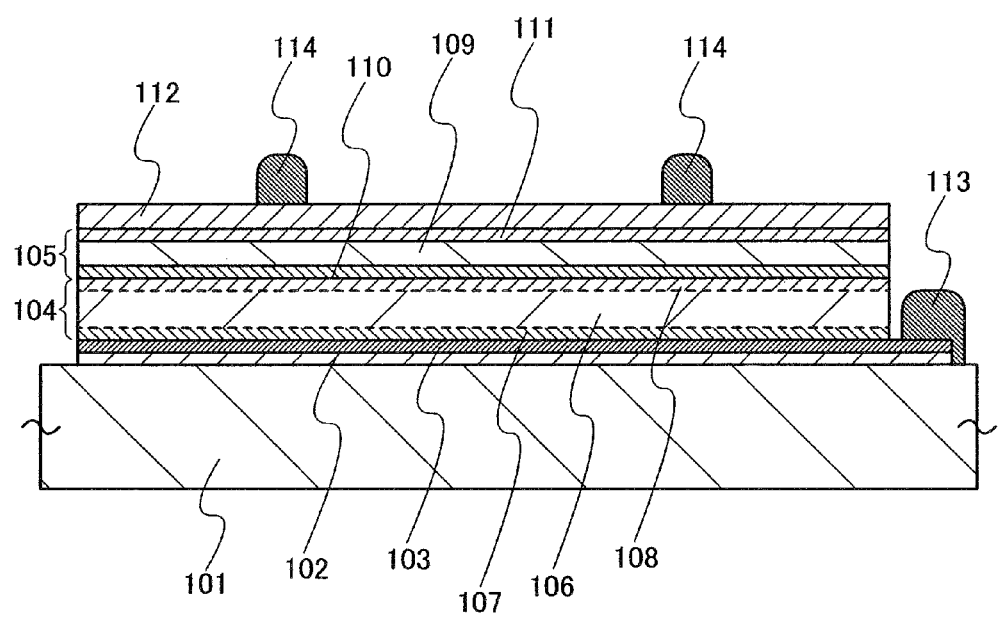
FIG. 2 is a cross-sectional view showing the structure of the tandem photoelectric conversion device.

A cross-sectional structure of the photoelectric conversion device along section line A-B of FIG. 1 is shown in FIG. 2. FIG. 2 illustrates a so-called tandem photoelectric conversion device in which the first unit cell 104 and the second unit cell 105 are stacked over the supporting substrate 101. The supporting substrate 101 is a substrate having an insulating surface or an insulating substrate; for example, any of a variety of glass substrates that are used in the electronics industry, such as an aluminosilicate glass substrate, an aluminoborosilicate glass substrate, and a barium borosilicate glass substrate, can be used.

An insulating layer 102 is provided between the supporting substrate 101 and the first unit cell 104. A first electrode 103 is provided between the first unit cell 104 and the insulating layer 102 and a second electrode 112 is provided over the second unit cell 105. The insulating layer 102 is bonded to the supporting substrate 101 and disposed in close contact with the first electrode 103, whereby the first unit cell 104 and the second unit cell 105 are fixed to the supporting substrate 101. The insulating layer 102 is formed of an insulating film having a smooth and hydrophilic surface in order to bond to the supporting substrate 101.

Single crystal silicon is typically used for a single crystal semiconductor layer 106 of the first unit cell 104. Alternatively, a polycrystalline semiconductor (typically polycrystalline silicon) layer can be used instead of the single crystal semiconductor layer. A first impurity semiconductor layer 107 having one conductivity type and a second impurity semiconductor layer 108 having a conductivity type opposite to the one conductivity type are each formed by adding a predetermined impurity to the single crystal semiconductor layer 106. When the first impurity semiconductor layer 107 has p-type conductivity, the second impurity semiconductor layer 108 has n-type conductivity, and vice versa. As the p-type impurity, an element belonging to Group 13 in the periodic table, such as boron, is used; as the n-type impurity, an element belonging to Group 15 in the periodic table, such as phosphorus or arsenic, is used. The addition of an impurity element can be performed by ion implantation or ion doping. In this specification, ion implantation indicates a method by which an ionized gas which has been subjected to mass separation is introduced into a semiconductor, and ion doping indicates a method by which an ionized gas which has not been subjected to mass separation is introduced into a semiconductor.

The single crystal semiconductor layer 106 is obtained by slicing a single crystal semiconductor substrate. For example, the single crystal semiconductor layer 106 is formed by a separation method using hydrogen ion implantation in which hydrogen ions are introduced into a single crystal semiconductor substrate at a predetermined depth at high concentration and then heat treatment is performed to separate a single crystal silicon layer of an upper portion of the single crystal semiconductor substrate. Alternatively, a method may be employed in which a single crystal semiconductor is epitaxially grown on porous silicon and a porous silicon layer is separated by cleavage by water-jetting. As the single crystal semiconductor substrate, a single crystal silicon wafer is typically used. The thickness of the single crystal semiconductor layer 106 is equal to or more than 0.1 µm and equal to or less than 10 µm, preferably equal to or more than 1 µm and equal to or less than 5 µm. In the case of using a single crystal silicon semiconductor for the single crystal semiconductor layer 106, the single crystal semiconductor layer 106 needs to have thickness of the above range to absorb sunlight since the single crystal silicon semiconductor has an energy gap of 1.12 eV and is of indirect transition type.

For a non-single-crystal semiconductor layer 109 of the second unit cell 105, amorphous silicon is typically used. Alternatively, a microcrystal semiconductor layer (typically microcrystal silicon) can be used instead of the amorphous semiconductor layer. A third impurity semiconductor layer 110 having one conductivity type and a fourth impurity semiconductor layer 111 having a conductivity type opposite to the one conductivity type are each formed of an amorphous semiconductor layer or a microcrystal semiconductor layer including a predetermined impurity. Amorphous silicon or microcrystal silicon is typically used, and amorphous silicon carbide can alternatively be used. If the third impurity semiconductor layer 110 has p-type conductivity, the fourth impurity semiconductor layer 111 has n-type conductivity, and vice versa.

The non-single-crystal semiconductor layer 109 is formed by decomposing a reactive gas including a semiconductor source gas with an electromagnetic energy. As the semiconductor source gas, a hydride of silicon typified by silane or disilane, a fluoride of silicon, or a chloride of silicon is used. Such a semiconductor source gas or a semiconductor source gas including hydrogen or an inert gas is used as the reactive gas. The non-single-crystal semiconductor layer 109 is formed by a plasma CVD apparatus using this reactive gas, with a high-frequency electric power of 10 to 200 MHz applied as the electromagnetic energy. As the electromagnetic energy, a microwave electric power of 1 to 5 GHz, typically 2.45 GHz may be applied instead of the high-frequency electric power. The third impurity semiconductor layer 110 and the fourth impurity semiconductor layer 111 are formed similarly by a plasma CVD method in such a manner that diborane is added as the impurity to the reactive gas in the case of giving p-type conductivity and phosphine is added as the impurity to the reactive gas in the case of giving n-type conductivity. As the non-single-crystal semiconductor layer 109, an amorphous silicon layer is typically used. The thickness of the non-single-crystal semiconductor layer 109 is equal to or more than 50 nm and equal to or less than 300 nm, preferably equal to or more than 100 nm and equal to or less than 200 nm. In the case of using an amorphous silicon semiconductor with an energy gap of 1.75 eV for the non-single-crystal semiconductor layer 109, the thickness of the above range allows the non-single-crystal semiconductor layer 109 to absorb light with shorter wavelengths than 600 nm to convert into electricity.

As the non-single-crystal semiconductor layer 109 of the second unit cell 105, a microcrystal semiconductor layer (typically a microcrystalline silicon layer) can also be used. $SiH_4$ is a typical semiconductor source gas used for forming the microcrystal semiconductor layer, and $Si_2H_6$ can alternatively be used. Further, $SiH_2Cl_2$, $SiHCl_3$, $SiCl_4$, $SiF_4$, or the like may be mixed to $SiH_4$ as appropriate. The microcrystal semiconductor layer is formed by a plasma CVD method using this semiconductor source gas diluted with hydrogen; fluorine; or hydrogen or fluorine and one or more of rare gas elements of helium, argon, krypton, and neon. The dilution ratio is preferably 10 times to 3000 times. Film deposition is performed by glow discharge plasma generated under reduced pressure of about 0.1 to 133 Pa. As the electric power for generating plasma, high-frequency electric power of 10 to 200 MHz, or microwave electric power of 1 to 5 GHz, typically 2.45 GHz is applied. A carbide gas such as $CH_4$ or $C_2H_6$ or a germanium gas such as $GeH_4$ or $GeF_4$ may be mixed into the semiconductor source gas so that the energy band width is adjusted to be 1.5 to 2.4 eV or 0.9 to 1.1 eV. The microcrystal semiconductor layer has lattice distortion which changes the optical characteristics from indirect transition type of single crystal silicon to direct transition type. The lattice distortion of at least 10% causes the optical characteristics to change into direct transition type; however, the local distortion makes the optical characteristics in which direct transition and indirect transition are mixed. The microcrystalline silicon layer has an energy gap of about 1.45 eV which is wider than that of single crystal silicon; therefore, light with shorter wavelengths than 600 nm can be absorbed and converted into electricity.

The photoelectric conversion device of this embodiment mode has a structure in which light enters from the second electrode 112 side. The second electrode 112 is formed of a transparent electrode material such as indium tin oxide, tin oxide, or zinc oxide. The first electrode 103 is formed of a metal material selected from titanium, molybdenum, tungsten, tantalum, chromium, or nickel. The first electrode 103 includes a layer of a nitride of titanium, molybdenum, tungsten, or tantalum, and the layer of the nitride thereof is in contact with the first impurity semiconductor layer 107. With the provision of the metal nitride between the semiconductor layer and the metal layer, the layers can have closer contact with each other.

Figure 3:
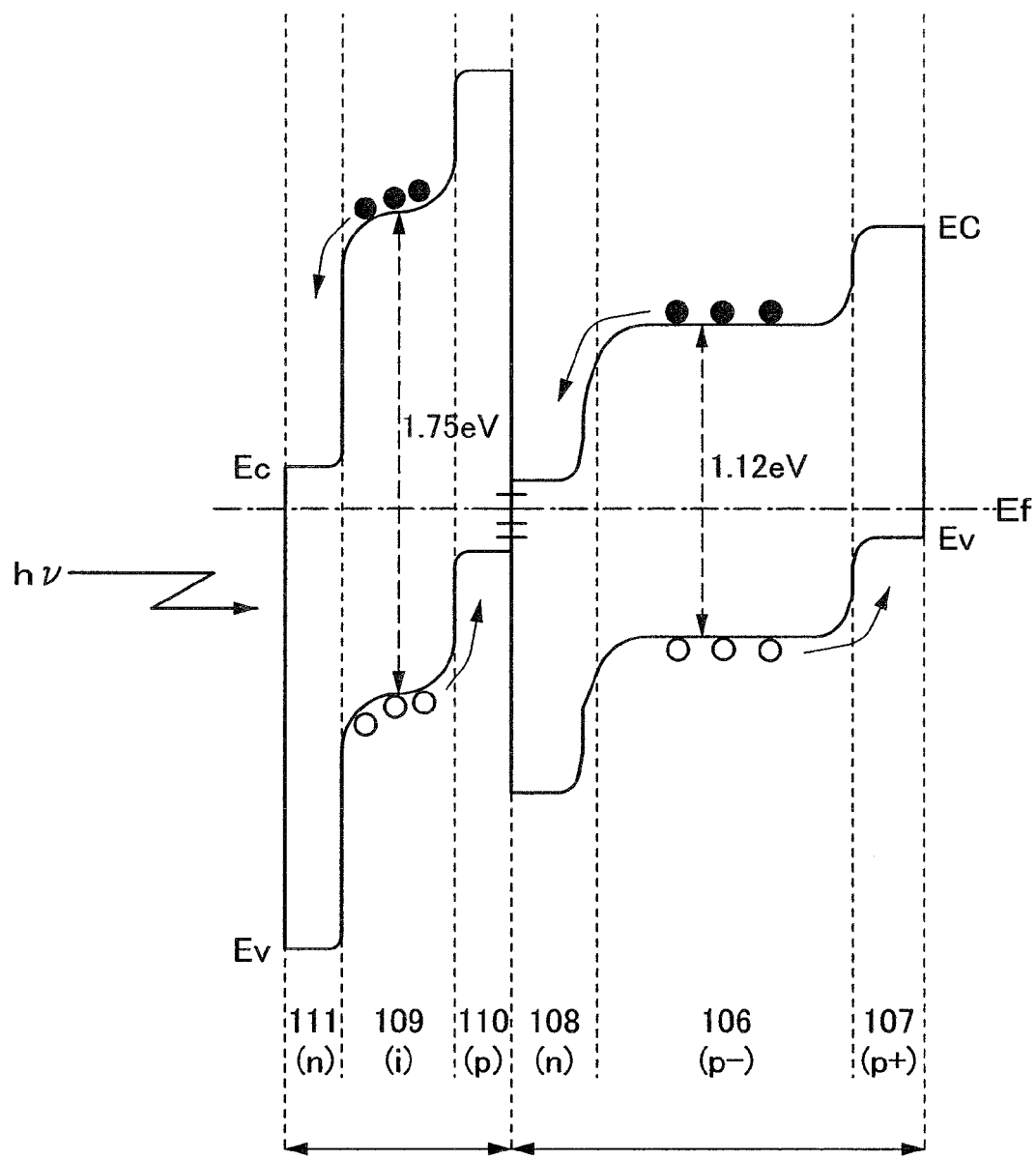
FIG. 3 shows an example of an energy band diagram of the tandem photoelectric conversion device.

FIG. 3 is an energy band diagram in the case of using the first unit cell 104 including the single crystal semiconductor layer 106 with an energy gap of 1.12 eV and the second unit cell 105 including the non-single-crystal semiconductor layer 109 with an energy gap of 1.75 eV. The second unit cell 105 including the non-single-crystal semiconductor layer 109 with wide energy gap is provided on the side from which light enters and the first unit cell 104 including the single crystal semiconductor layer 106 with narrow energy gap is provided behind the second unit cell 105. Note that the first impurity semiconductor layer 107 and the third impurity semiconductor layer 110 are p-type semiconductor and the second impurity semiconductor layer 108 and the fourth impurity semiconductor layer 111 are n-type semiconductor in this case.

As shown in the band diagram of FIG. 3, electrons excited by light absorption flow to the n-type semiconductor side and holes flow to the p-type semiconductor side. A p-n junction is formed at the connection portion of the first unit cell 104 and the second unit cell 105 and a diode is inserted in a direction opposite to a direction of current flow in an equivalent circuit. In this case, recombination centers are formed at the bonding interface between the second impurity semiconductor layer 108 and the third impurity semiconductor layer 110 such that recombination current can flow at the bonding interface. The second impurity semiconductor layer 108 is a single crystal semiconductor, and an amorphous semiconductor layer or a microcrystal semiconductor layer is formed by a plasma CVD method or the like as the third impurity semiconductor layer 110 thereover, thereby a bond through which recombination current flows can be formed at the bonding interface.

In the tandem photoelectric conversion device of FIG. 2, the first unit cell 104 formed of the single crystal semiconductor layer 106 is used as the bottom cell; thus, light with long wavelengths of 800 nm or longer can be absorbed and converted into electricity, which contributes to improvement of photoelectric conversion efficiency. In this case, the single crystal semiconductor layer 106 is thinned to have a thickness of 10 μm or less, so that loss due to recombination of photogenerated carriers can be decreased.

Figure 4:
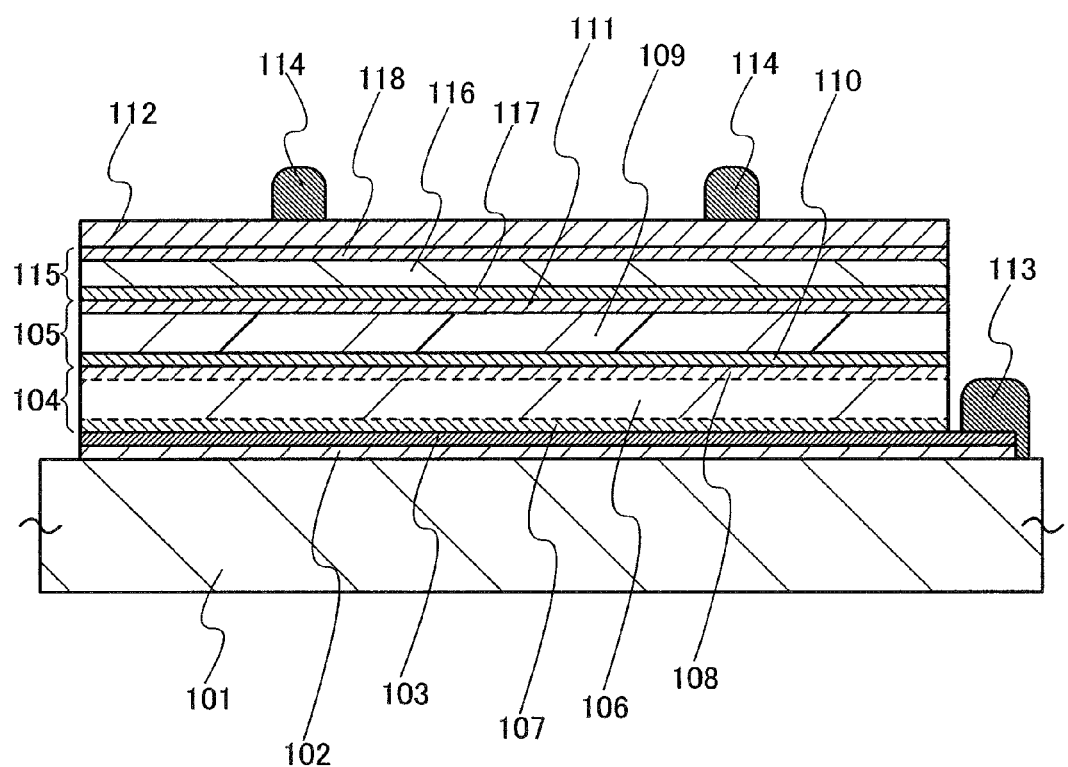
FIG. 4 is a cross-sectional view showing a structure of a stacked photoelectric conversion device.

FIG. 4 shows an example of a stacked photoelectric conversion device in which three unit cells are stacked. The first unit cell 104 provided over the supporting substrate 101 includes the single crystal semiconductor layer 106 as a photoelectric conversion layer, the second unit cell 105 provided over the first unit cell 104 includes the non-single-crystal semiconductor layer 109 as a photoelectric conversion layer, and a third unit cell 115 provided over the second unit cell 105 includes a non-single-crystal semiconductor layer 116 as a photoelectric conversion layer.

In this case, since the single crystal semiconductor layer 106 has an energy gap of 1.12 eV, it is preferable that the energy gaps of the non-single-crystal semiconductor layer 109 of the second unit cell 105 and the non-single-crystal semiconductor layer 116 of the third unit cell 115, which are located closer to the side from which light enters than the first unit cell 104, be 1.45 to 1.65 eV and 1.7 to 2.0 eV, respectively. This is because sunlight can be effectively absorbed by absorbing light with different wavelength ranges in the unit cells.

Amorphous silicon germanium or amorphous silicon is used such that the non-single-crystal semiconductor layer 109 of the second unit cell 105 has an energy gap of 1.45 to 1.65 eV. Amorphous silicon (1.75 eV) or amorphous silicon carbide (1.8 to 2.0 eV) is used such that the non-single-crystal semiconductor layer 116 of the third unit cell 115 has an energy gap of 1.7 to 2.0 eV.

Note that in FIG. 4, a fifth impurity semiconductor layer 117 is similar to the third impurity semiconductor layer 110 and a sixth impurity semiconductor layer 118 is similar to the fourth impurity semiconductor layer 111; therefore detailed description thereof is omitted.

Embodiment Mode 2

Next, a method for manufacturing the photoelectric conversion device 100 with its cross-sectional structure along section line A-B of FIG. 1 corresponding to the structure shown in FIG. 2 will be described.

Figure 5A:
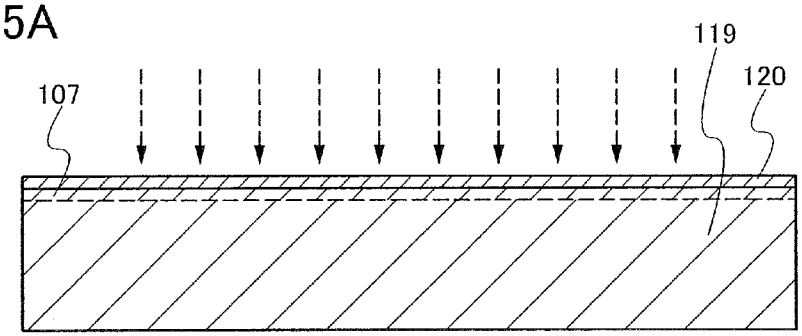
FIGS. 5A to 5D are cross-sectional views for describing a process for manufacturing the stacked photoelectric conversion device.

A semiconductor substrate 119 shown in FIG. 5A is a substrate with a shape about a quadrangular shape, cut out from a circular single crystal semiconductor substrate. The shape of a top surface of the semiconductor substrate 119 is not limited in particular; however, the semiconductor substrate 119 preferably has the shape about a quadrangular shape in the case where a supporting substrate which supports a single crystal semiconductor layer is rectangular in shape. The semiconductor substrate 119 is typically single crystal silicon and preferably has its surface polished to have a mirror surface. This is because the semiconductor substrate 119 is disposed in close contact with the supporting substrate with an insulating layer for bonding interposed therebetween. For example, a p-type single crystal silicon wafer with a resistivity of about 1 to 10 Ωcm is used as the semiconductor substrate 119. The shape of the top surface of the semiconductor substrate 119 is preferably about a quadrangular shape as described above.

It is preferable that a protection film 120 be formed of silicon oxide or silicon nitride and a chemical vapor deposition method typified by a plasma CVD method is used for the formation. The protection film 120 is preferably provided to prevent the surface of the semiconductor substrate 119 from losing its planarity due to irradiation with ions at the time of forming a damaged layer in the semiconductor substrate 119. It is preferable that the protection film 120 be provided to have a thickness of 50 to 200 nm.

Next, the first impurity semiconductor layer 107 having one conductivity type is formed in the semiconductor substrate 119. For example, boron is added as an impurity which imparts one conductivity type so that the first impurity semiconductor layer 107 is formed to have p-type conductivity. In the photoelectric conversion device of this embodiment mode, the first impurity semiconductor layer 107 is disposed on the side opposite to the side from which light enters so that a back surface field (BSF) is formed. It is preferable that the addition of boron be performed using an ion doping apparatus by which a substrate is irradiated with ions which are accelerated by an electric field without mass separation with $B_2H_6$ or $BF_3$ used as a source gas. This is because, even when the area of the semiconductor substrate 119 is more than an area of 300 mm diagonal, the area to be irradiated with the ion beam can be enlarged to perform the process effectively. For example, a linear ion beam with a length of more than 300 mm on a long side is formed and delivered from one end to the other end of the semiconductor substrate 119, so that the first impurity semiconductor layer 107 can be homogeneously formed over the entire surface of the semiconductor substrate 119.

Figure 5B:
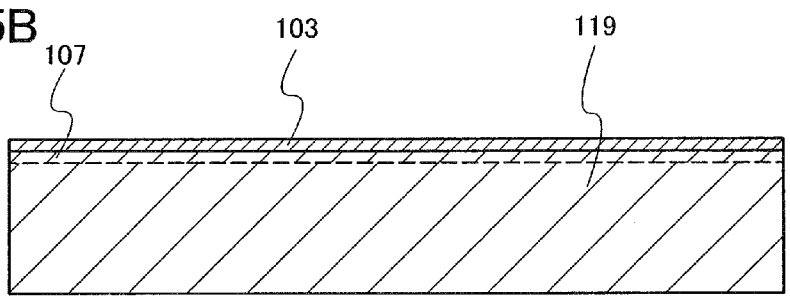

In FIG. 5B, the protection film 120 is removed and the first electrode 103 is formed over the first impurity semiconductor layer 107. It is preferable that the first electrode 103 be formed of heat-resistant metal. As the heat-resistant metal, a metal material such as titanium, molybdenum, tungsten, tantalum, chromium, or nickel is used. A nitride of any of these metal materials may be formed in contact with the first impurity semiconductor layer 107 so that the first electrode 103 is formed to have a stacked structure. By the formation of the nitride of metal, the first electrode 103 and the first impurity semiconductor layer 107 can have closer contact with each other. The first electrode 103 is formed by a vacuum deposition method or a sputtering method.

Figure 5C:
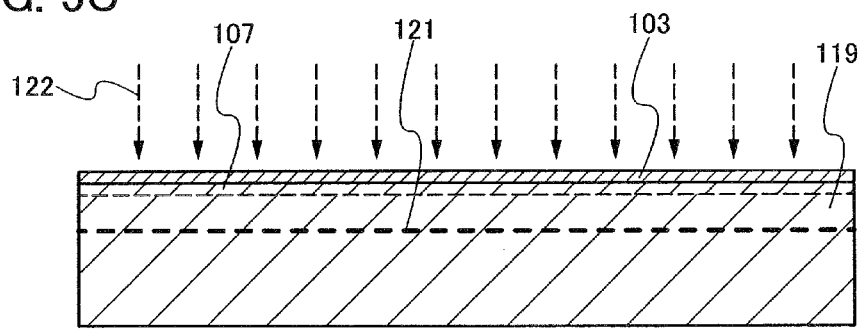

FIG. 5C shows a step of forming a damaged layer 121 by irradiating the surface of the semiconductor substrate 119, provided with the first electrode 103, with ion beams 122 including hydrogen ions. As the hydrogen ions, preferably, cluster ions typified by $H_3^+$ are introduced to form the damaged layer 121 at a certain depth from the surface. The depth of the damaged layer 121 depends on the acceleration energy of the ions. The thickness of the single crystal semiconductor layer separated from the semiconductor substrate 119 is determined depending on the depth of the damaged layer 121; therefore, the electric field intensity for accelerating cluster ions is determined in consideration of the thickness of the single crystal semiconductor layer. It is preferable that the damaged layer 121 be formed at a depth of less than 10 μm, that is, equal to or more than 50 nm and less than 10000 nm, preferably equal to or more than 100 nm and equal to or less than 5000 nm from the surface of the semiconductor substrate 119. By introducing the cluster ions into the semiconductor substrate 119 through the first electrode 103, the surface of the semiconductor substrate 119 can be prevented from being damaged by the ion irradiation.

The hydrogen cluster ions typified by $H_3^+$ can be introduced into a Si wafer, using an ion doping apparatus in such a manner that hydrogen plasma is generated and ions generated in the plasma are accelerated by an electric field without mass separation. With the use of the ion doping apparatus, ion irradiation can be easily performed even on the semiconductor substrate 119 which is large in area.

Figure 10:
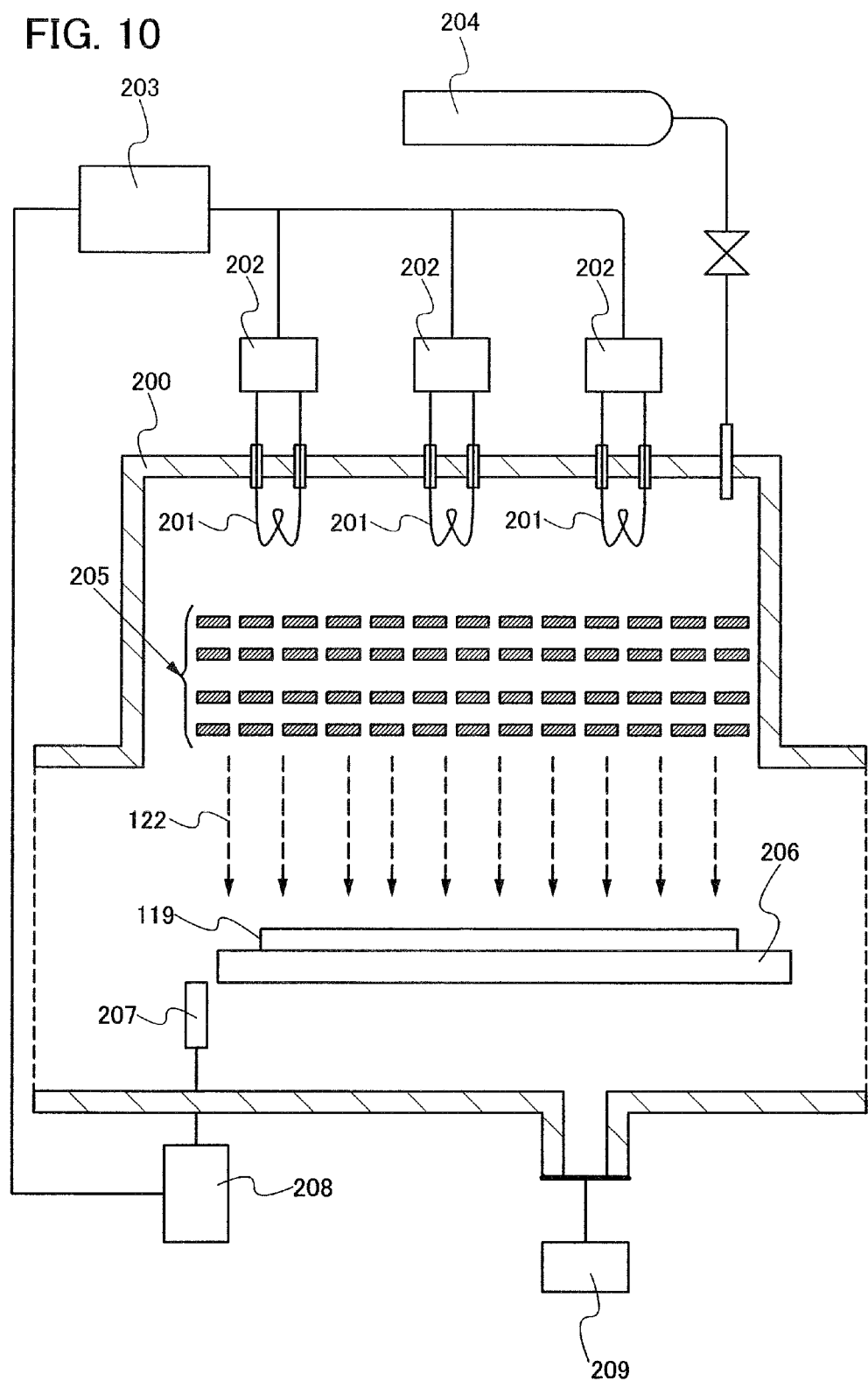
FIG. 10 is a schematic view showing a structure of an ion doping apparatus.

FIG. 10 is a schematic view showing a structure of an ion doping apparatus by which plural kinds of ions generated from an ion source 200 are introduced to the semiconductor substrate 119 without mass separation. A predetermined gas such as hydrogen is supplied from a gas supplying portion 204 to the ion source 200. The ion source 200 is provided with filaments 201. A filament power source 202 applies ark discharge voltage to each filament 201 to control the amount of current that flows to the filament 201. The gas supplied from the gas supplying portion 204 is exhausted from an exhaustion system 209.

The ions generated from the ion source 200 are extracted through an extraction electrode system 205 to form the ion beams 122. The semiconductor substrate 119 disposed on a mounting board 206 is irradiated with the ion beams 122. The proportions of the ion species in the ion beams 122 are calculated with a mass spectrometer tube 207 disposed near the mounting board 206. The ion density calculated with the mass spectrometer tube 207 is converted into signals by using a mass spectrometer 208 and the results may be fed back to a power source controller 203. The filament power sources 202 can be controlled by the power source controller 203 in accordance with the calculation results on the ion density.

The gas of hydrogen or the like supplied from the gas supplying portion 204 flows through the chamber of the ion doping apparatus and is exhausted through the exhaustion system 209. Hydrogen supplied to the ion source 200 is ionized through the reaction represented by formula (1):

$$H_2 + e^- \rightarrow H_2^+ + 2e^- - Q(Q=15.39 \text{ eV}) \quad (1)$$

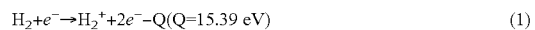

The pressure in the chamber of the ion doping apparatus is $1 \times 10^{-2}$ to $1 \times 10^{-1}$ Pa and the ionization degree is not so high; therefore, a larger amount of $H_2$ that is the source gas exists than $H_2^+$ ions. Therefore, $H_2^+$ ions generated from the ion sources react with $H_2$ before the extraction through the extraction electrode system 205, and the reaction thereof is represented by formula (2):

$$H_2^+ + H_2 \rightarrow H_3^+ + H + Q(Q=1.49 \text{ eV}) \quad (2)$$

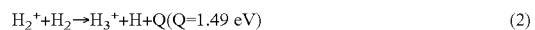

$H_3^+$ exists as a more stable molecule than $H^+$ and $H_2^+$; therefore, as the proportion of collision with $H_2$ becomes higher, the amount of $H_3^+$ generated is increased.

This is clear from the mass spectrometer result of the ion beams 122 flowing into the mounting board 206, with the use of the mass spectrometer tube 207; that is, the proportion of $H_3^+$ ions to the total amount of ion species $H^+$, $H_2^+$, and $H_3^+$ is equal to or more than 70%. Accordingly, the substrate is irradiated with ion beams in which a large amount of $H_3^+$ that are cluster ions are generated, which leads to a significant effect of improving the irradiation efficiency of hydrogen atoms as compared to the case of irradiation with $H^+$ or $H_2^+$ and containing hydrogen in the semiconductor substrate 119 at high concentration even if the dose is small.

As described above, increase of the proportion of $H_3^+$ enables the damaged layer 121 to contain hydrogen at a concentration which is equal to or more than $1 \times 10^{20}$ atoms/cm$^3$. In the damaged layer 121 formed in the semiconductor substrate 119, the crystal structure is damaged and microvoids are formed, so that a porous structure is formed. Therefore, the volume of microvoids formed in the damaged layer 121 is changed by thermal treatment at a relatively low temperature (equal to or less than 600° C.), and cleavage can be performed along the damaged layer 112 to obtain the single crystal semiconductor layer.

The surface of the semiconductor substrate 119 may be scanned with a linear ion beam the length of which is longer than the length of one side of the semiconductor substrate 119 with a shape about a quadrangular shape to introduce cluster ions. In this manner, the depth at which the damaged layer 121 is formed can be uniform.

Figure 5D:
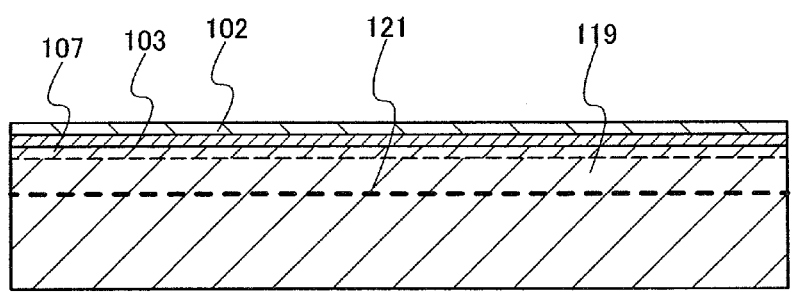

FIG. 5D shows a step of forming the insulating layer 102 over the first electrode 103. The insulating layer 102 is formed of an insulating film such as a silicon oxide film, a silicon oxynitride film, a silicon nitride oxide film, or a silicon nitride film. There is no limitation on the material for forming the insulating layer 102 as long as an insulating film can be formed, and a film the surface of which is smooth and hydrophilic may be used. As for the smoothness of the insulating layer 102, the mean surface roughness (Ra) is preferably equal to or less than 1 nm, more preferably equal to or less than 0.5 nm. The 'mean surface roughness' in this specification refers to a mean surface roughness obtained by three-dimensional expansion of centerline mean roughness which is defined by JIS B0601 so as to be able to be applied to a plane.

Note that the silicon oxynitride film means a film that contains higher content of oxygen than nitrogen and shows concentration ranges of oxygen, nitrogen, silicon, and hydrogen from 50 to 70 at. %, 0.5 to 15 at. %, 25 to 35 at. %, and 0.1 to 10 at. %, respectively in the measurement using Rutherford backscattering spectrometry (RBS) and hydrogen forward scattering (HFS). Further, the silicon nitride oxide film means a film that contains higher content of nitrogen than oxygen, and the measurement using RBS and HFS shows the concentration ranges of oxygen, nitrogen, silicon, and hydrogen from 5 to 30 at. %, 20 to 55 at. %, 25 to 35 at. %, and 10 to 30 at. %, respectively. Note that content ratios of nitrogen, oxygen, silicon, and hydrogen fall within the ranges given above when the total number of atoms contained in the silicon oxynitride film or the silicon nitride oxide film is defined as 100 at. %.

As silicon oxide containing hydrogen, for example, silicon oxide deposited by a chemical vapor deposition method using organosilane is preferable. For example, with use of a silicon oxide film as the insulating layer 102 which is deposited using organosilane, a bond between the supporting substrate and a semiconductor layer can be made strong. For the organosilane, an organic compound which contains silicon, such as tetraethoxysilane (TEOS) ($Si(OC_2H_5)_4$), tetramethylsilane (TMS) ($Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or tris(dimethylamino)silane ($SiH(N(CH_3)_2)_3$) can be used.

Silicon nitride containing hydrogen can be deposited by a plasma CVD method using a silane gas and an ammonia gas. Hydrogen may be added to the gases. Silicon nitride containing oxygen and hydrogen can be deposited by a plasma CVD method using a silane gas, an ammonia gas, and a nitrous oxide gas. In any case, any of silicon oxide, silicon oxynitride, or silicon nitride oxide, which contains hydrogen and is deposited by a chemical vapor deposition method such as a plasma CVD method, a low-pressure CVD method, or an atmospheric-pressure CVD method using a silane gas or the like as a source gas can be used. Recommended as the deposition temperature of the insulating layer 102 is a deposition temperature which is equal to or less than 350° C. at which hydrogen is not desorbed from the damaged layer 121 formed in the single crystal semiconductor substrate.

Figure 6A:
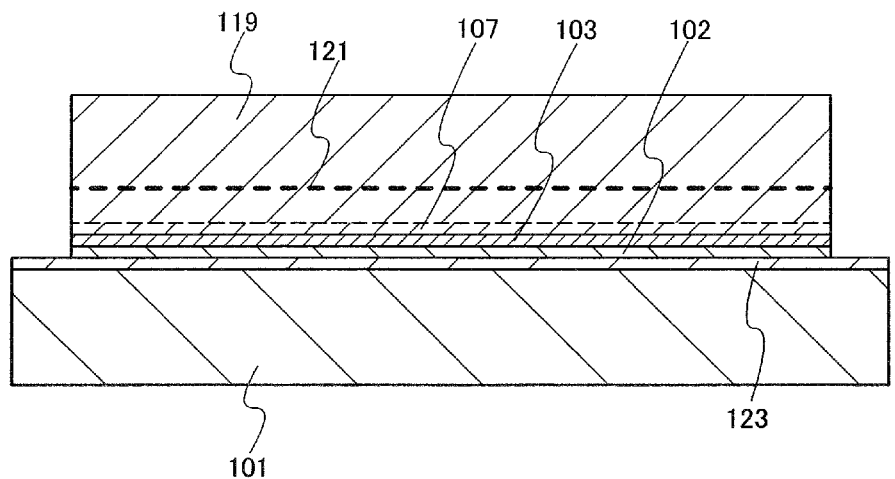
FIGS. 6A and 6B are cross-sectional views for describing the process for manufacturing the stacked photoelectric conversion device.

FIG. 6A shows a step of bonding the supporting substrate 101 and the semiconductor substrate 119 to each other. This bonding is formed in such a manner that the insulating layer 102 the surface of which is smooth and hydrophilic is firmly attached to the supporting substrate 101. This bond is formed by a hydrogen bond or Van der Waals forces. Hydroxyl groups or water molecules on surfaces of the semiconductor substrate 119 and the supporting substrate 101 which have become hydropholic serve as an adhesive, whereby the bond is formed. The water molecules are diffused by thermal treatment, and silanol groups (Si—OH) of remaining components are bonded to each other by a hydrogen bond. Further, in this bonding portion, by hydrogen being released, a siloxane bond (a Si—O—Si bond) is formed to generate a covalent bond, so that the bond between the semiconductor substrate 119 and the supporting substrate 101 can be made strong. Note that a silicon nitride film, a silicon nitride oxide film, or the like may be formed as a barrier layer 123 at a bonding surface of the supporting substrate 101. The provision of the barrier layer 123 can prevent contamination due to impurities from the supporting substrate 101.

In order to efficiently perform the bonding between the supporting substrate 101 and the insulating layer 102, the bonding surfaces thereof is preferably activated in advance. For example, one or both of the bonding surfaces are irradiated with an atom beam or an ion beam. In the case of utilizing an atom beam or an ion beam, a neutral atom beam or an ion beam of an inert gas such as argon can be used. Alternatively, the bonding surfaces can be activated by performing plasma irradiation or radical treatment. Such surface treatment facilitates formation of a bond between different materials even at a temperature of 400° C. or less.

Figure 6B:
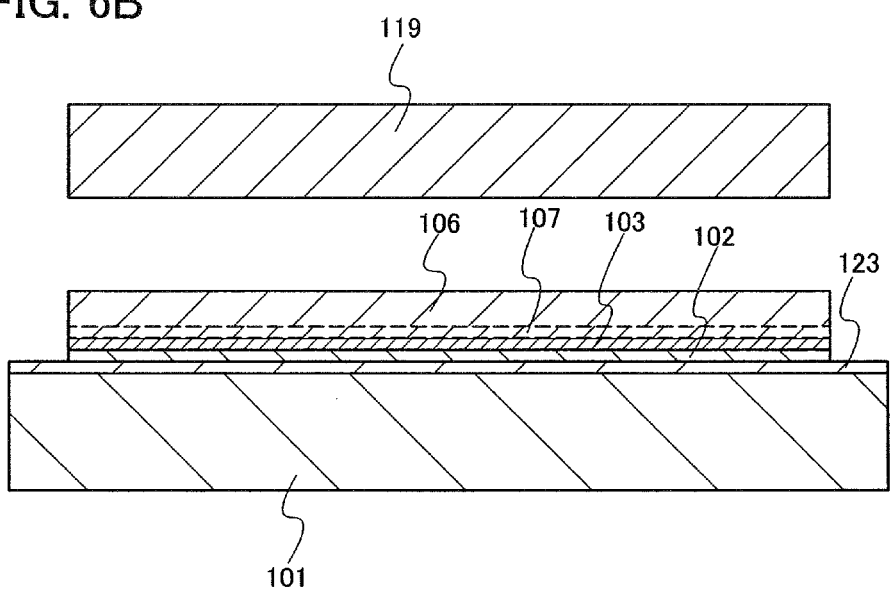

FIG. 6B shows a step of separating part of the semiconductor substrate 119 from the supporting substrate 101 by heat treatment, with the damaged layer 121 served as a cleavage plane. The heat treatment is performed preferably at a temperature which is equal to or more than the deposition temperature of the insulating layer 102 and equal to or less than the upper temperature limit of the supporting substrate 101. For example, the heat treatment is performed at 400° C. to 600° C., so that the volume of microvoids formed in the damaged layer 121 is changed, and the semiconductor substrate 119 is cleaved along the region. Since the insulating layer 102 is bonded to the supporting substrate 101, the single crystal semiconductor layer 106 and the first electrode 103 remain over the supporting substrate 101. At this time, the thickness of the single crystal semiconductor layer 106 approximately corresponds to the depth at which the damaged layer 121 is formed, and the single crystal semiconductor layer 106 is formed to a thickness of equal to or more than 50 nm and less than 10,000 nm, preferably 100 to 5,000 nm.

Through the above-described steps, the single crystal semiconductor layer 106 which is fixed to the supporting substrate 101 by the insulating layer 102 can be provided.

Figure 7A:
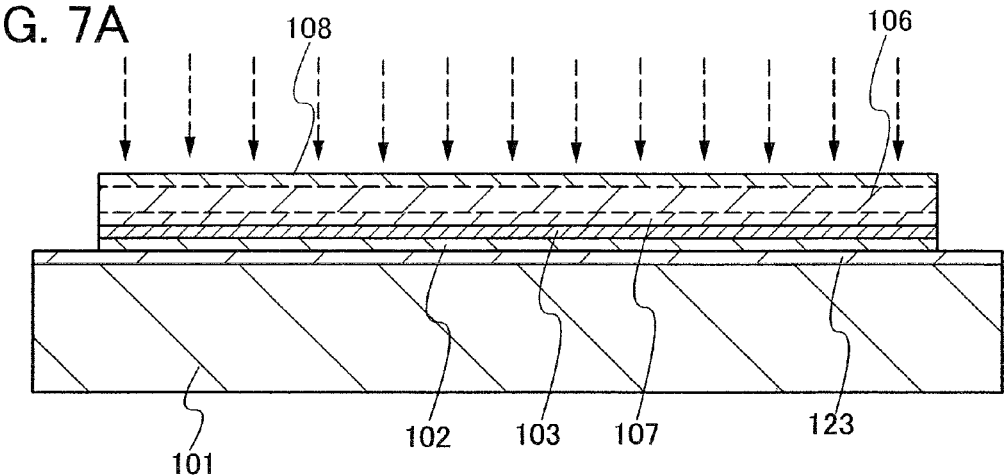
FIGS. 7A to 7C are cross-sectional views for describing the process for manufacturing the stacked photoelectric conversion device.

FIG. 7A shows a step of adding an impurity having an opposite conductivity type to that of the first impurity semiconductor layer 107, to the single crystal semiconductor layer 106 to form the second impurity semiconductor layer 108. For example, phosphorus or arsenic is added such that the second impurity semiconductor layer 108 has n-type conductivity. It is preferable that the surface of the single crystal semiconductor layer 106 is removed by etching in advance because it is closest to the damaged layer 121 or contains part of the damaged layer 121; either dry etching or wet etching is performed.

Figure 7B:
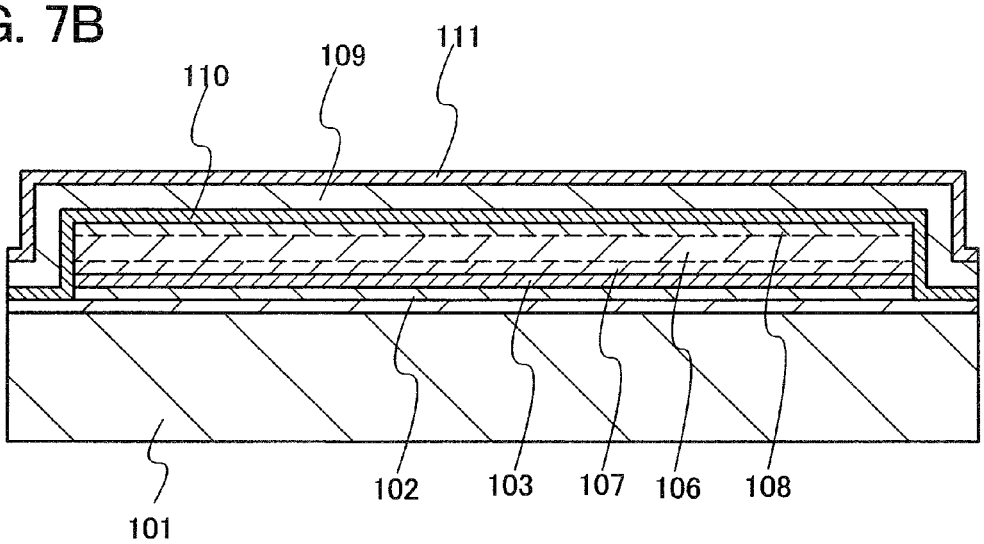

Next, as shown in FIG. 7B, the third impurity semiconductor layer 110, the non-single-crystal semiconductor layer 109, and the fourth impurity semiconductor layer 111 are formed. The third impurity semiconductor layer 110 is formed of a p-type amorphous semiconductor layer (e.g., a p-type amorphous silicon layer) or a p-type microcrystalline semiconductor layer (e.g., a p-type microcrystalline silicon layer) to have a thickness of 10 to 20 nm. The non-single-crystal semiconductor layer 109 is formed of an amorphous silicon layer to have a thickness of 100 to 300 nm (preferably equal to or more than 100 nm and equal to or less than 200 nm). The fourth impurity semiconductor layer 111 is formed of an n-type amorphous semiconductor layer (e.g., an n-type amorphous silicon layer) or an n-type microcrystalline semiconductor layer (e.g., an n-type microcrystalline silicon layer) to have a thickness of 20 to 60 nm.

The third impurity semiconductor layer 110, the non-single-crystal semiconductor layer 109, and the fourth impurity semiconductor layer 111 are formed by a plasma CVD method. As an electric power frequency for exciting plasma, high-frequency electric power in the HF band or the VHF band of 10 to 200 MHz, or microwave electric power of 1 to 5 GHz, typically 2.45 GHz, is applied. As a reactive gas containing a semiconductor source gas, a gas containing hydride of silicon typified by silane or disilane, a gas containing fluoride of silicon or chloride of silicon is used, and hydrogen or an inert gas is mixed with the gas as appropriate to be used. Diborane ($B_2H_6$) is added for controlling valence electron to provide p-type conductivity, and phosphine ($PH_3$) is used for controlling valence electron to provide n-type conductivity. Note that the amount of the impurity in the non-single crystal semiconductor layer 109 is preferably reduced; it is preferable that the concentration of either oxygen or nitrogen be $1×10^{19}/cm^3$ or less, more preferably $5×10^{18}/cm^3$ or less.

Figure 7C:
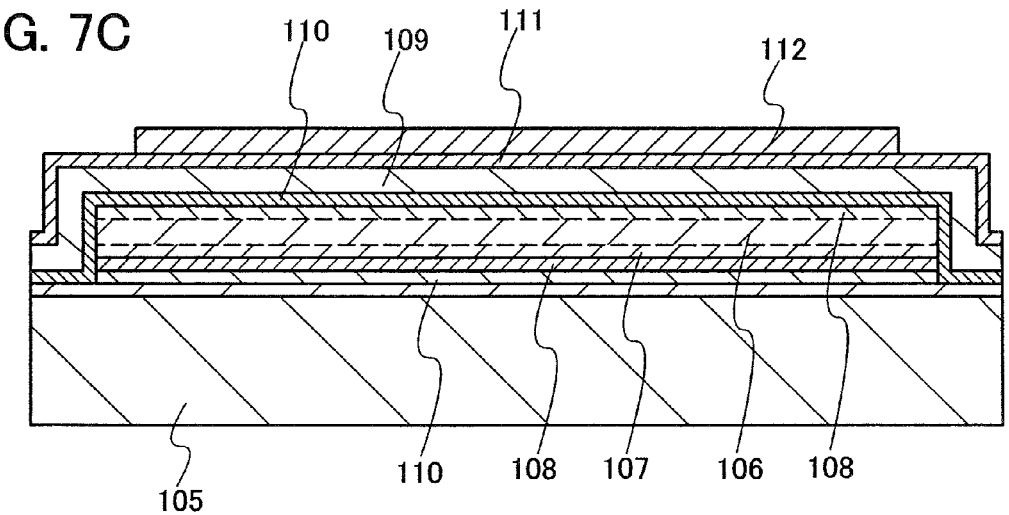

As shown in FIG. 7C, the second electrode 112 is formed over the fourth impurity semiconductor layer 111. The second electrode 112 is formed using a transparent conductive material. As the transparent conductive material, metal oxide such as an indium tin oxide alloy (ITO), zinc oxide (ZnO), tin oxide ($SnO_2$), or an ITO—ZnO alloy is used. The thickness of the second electrode 112 is 40 to 200 nm (preferably 50 to 100 nm). The sheet resistance of the second electrode 112 may be about 20 to 200Ω/□ (ohm/square).

The second electrode 112 is formed by a sputtering method or a vacuum evaporation method. In this case, the second electrode 112 is formed using a shadow mask such that the second electrode 112 is selectively formed in a region where the first unit cell 104 and the second unit cell 105 overlap with each other. The third impurity semiconductor layer 110, the non-single-crystal semiconductor layer 109, and the fourth impurity semiconductor layer 111 which are formed by a plasma CVD method are formed over an entire surface of the supporting substrate 101; therefore, in the case where an unnecessary region thereof is removed, the second electrode 112 can be used as a mask for etching.

Note that a conductive macromolecular material (also called a 'conductive polymer') can be used instead of the above-described metal oxide in order to form the second electrode 112. As the conductive macromolecular material, π electron conjugated conductive polymer can be used. For example, polyaniline or a derivative thereof, polypyrrole or a derivative thereof, polythiophene or a derivative thereof, and a copolymer of two or more kinds of those materials can be given.

FIG. 8A shows a step of etching the fourth impurity semiconductor layer 111, the non-single-crystal semiconductor layer 109, the third impurity semiconductor layer 110, the second impurity semiconductor layer 108, the single crystal semiconductor layer 106, and the first impurity semiconductor layer 107 with the use of the second electrode 112 as a mask to expose an end portion of the first electrode 103. For the etching, dry etching is performed using a gas of $NF_3$, $SF_6$, or the like.

FIG. 8B shows a step of forming a passivation layer 124 which also serves as an anti-reflection layer over the supporting substrate 101 provided with the first unit cell 104 and the second unit cell 105. The passivation layer 124 is formed of silicon nitride, silicon nitride oxide, or magnesium fluoride. In order to form a contact with auxiliary electrodes, openings are formed in the passivation layer 124 such that parts of the surfaces of the first electrode 103 and the second electrode 112 are exposed. The openings of the passivation layer 124 are formed by an etching process. Alternatively, a passivation layer provided with openings is formed as the passivation layer 124; in this case, a method using a shadow mask described above, or a method using a lift-off method can be employed.

FIG. 8C shows a step of forming the first auxiliary electrode 113 which is in contact with the first electrode 103 and the second auxiliary electrode 114 which is in contact with the second electrode 112. As shown in FIG. 1, the second auxiliary electrode 114 is a comb-shaped or lattice-shaped electrode. The first auxiliary electrode 113 and the second auxiliary electrode 114 may be formed of aluminum, silver, lead-tin (solder), or the like. For example, the first auxiliary electrode 113 and the second auxiliary electrode 114 are formed by a screen printing method using a silver paste.

Through the above-described process, the photoelectric conversion device can be manufactured. According to the process in this embodiment mode, a technique of bonding different materials is used so that a photoelectric conversion device which includes a bottom cell including a single crystal semiconductor layer with a thickness of 10 μm or less as a photoelectric conversion layer and a top cell, which is stacked over the bottom cell, including a non-single-crystal semiconductor layer as a photoelectric conversion layer can be manufactured at a process temperature of 700° C. or less (preferably equal to or less than 500° C.). That is, the photoelectric conversion device can be manufactured over the large-area glass substrate the upper temperature limit of which is equal to or lower than 700° C., which includes the bottom cell including the single crystal semiconductor layer as a photoelectric conversion layer and the top cell including the non-single-crystal semiconductor layer as a photoelectric conversion layer, which is stacked over the bottom cell. The single crystal semiconductor layer is obtained by separating an upper portion of the single crystal semiconductor substrate. The single crystal semiconductor substrate can be used repeatedly, which leads to effective use of resources.

Embodiment Mode 3

In Embodiment Mode 2, in some cases, due to the formation of the damaged layer 121, crystal defects remain at the surface of the single crystal semiconductor layer 106 which is exposed through the separation of part of the semiconductor substrate 119 shown in FIG. 6B. In those cases, it is preferable that the surface portion of the single crystal semiconductor layer 106 be removed by etching. For the etching, either dry etching or wet etching is performed. Further, in some cases, a rough surface remains in which mean surface roughness (Ra) is 7 to 10 nm and the largest difference in height between peak and valley (P–V) is 300 to 400 nm. The 'largest difference in height between peak and valley' in this specification refers to a difference in height between the peak and valley. The 'peak' and the 'valley' in this embodiment refer to a peak and a valley obtained by three-dimensional expansion of the "peak" and the "valley" defined by JIS B0101. The peak is represented as the highest part of the peaks in the specified surface. The valley is represented as the lowest part of the valleys in the specified surface.

Figure 9:
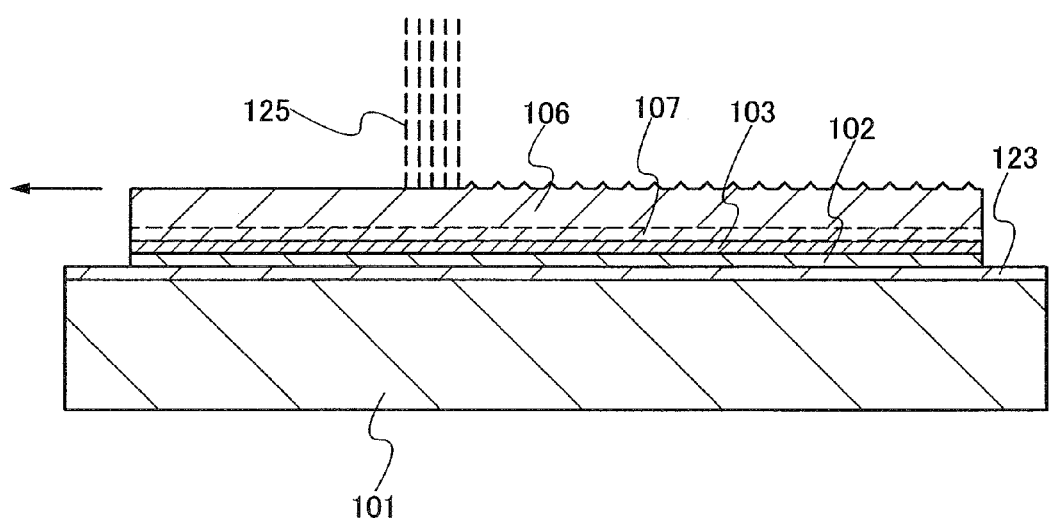
FIG. 9 is a cross-sectional view for describing a step for manufacturing the stacked photoelectric conversion device.

Furthermore, in order to repair the single crystal semiconductor layer 106 in which crystal defects remain, it is preferable to perform laser treatment. FIG. 9 shows the laser treatment performed on the single crystal semiconductor layer 106. The single crystal semiconductor layer 106 is irradiated with a laser beam 125, so that at least the surface side of the single crystal semiconductor layer 106 is melted and is recrystallized in the following cooling step, using a lower portion of the single crystal semiconductor layer 106 in a solid-phase state as seed crystals; in this manner, defects of the single crystal semiconductor layer 106 can be repaired. Further, if the laser treatment is performed in an inert gas atmosphere, the surface of the single crystal semiconductor layer 106 can be planarized.

For this laser treatment, it is preferable that the region to be irradiated with a laser beam be heated at 250° C. to 600° C. in advance. The region to be irradiated is heated in advance, the melting time by the laser beam irradiation can be lengthened, and defects can be repaired more effectively. The laser beam 125 melts the surface side of the single crystal semiconductor layer 106, but hardly heats the supporting substrate 101; thus, a supporting substrate the upper temperature limit of which is low, such as a glass substrate, can be used. In addition, since the first electrode 103 is formed of heat-resistant metal, the single crystal semiconductor layer 106 is not adversely affected even if the single crystal semiconductor layer 106 is heated at the above-described temperature. Silicide is formed at an interface between the first electrode 103 and the first impurity semiconductor layer 107, so that current flows more smoothly. Activation of the second impurity semiconductor layer 108 can also be performed by this laser treatment.

Figure 11:
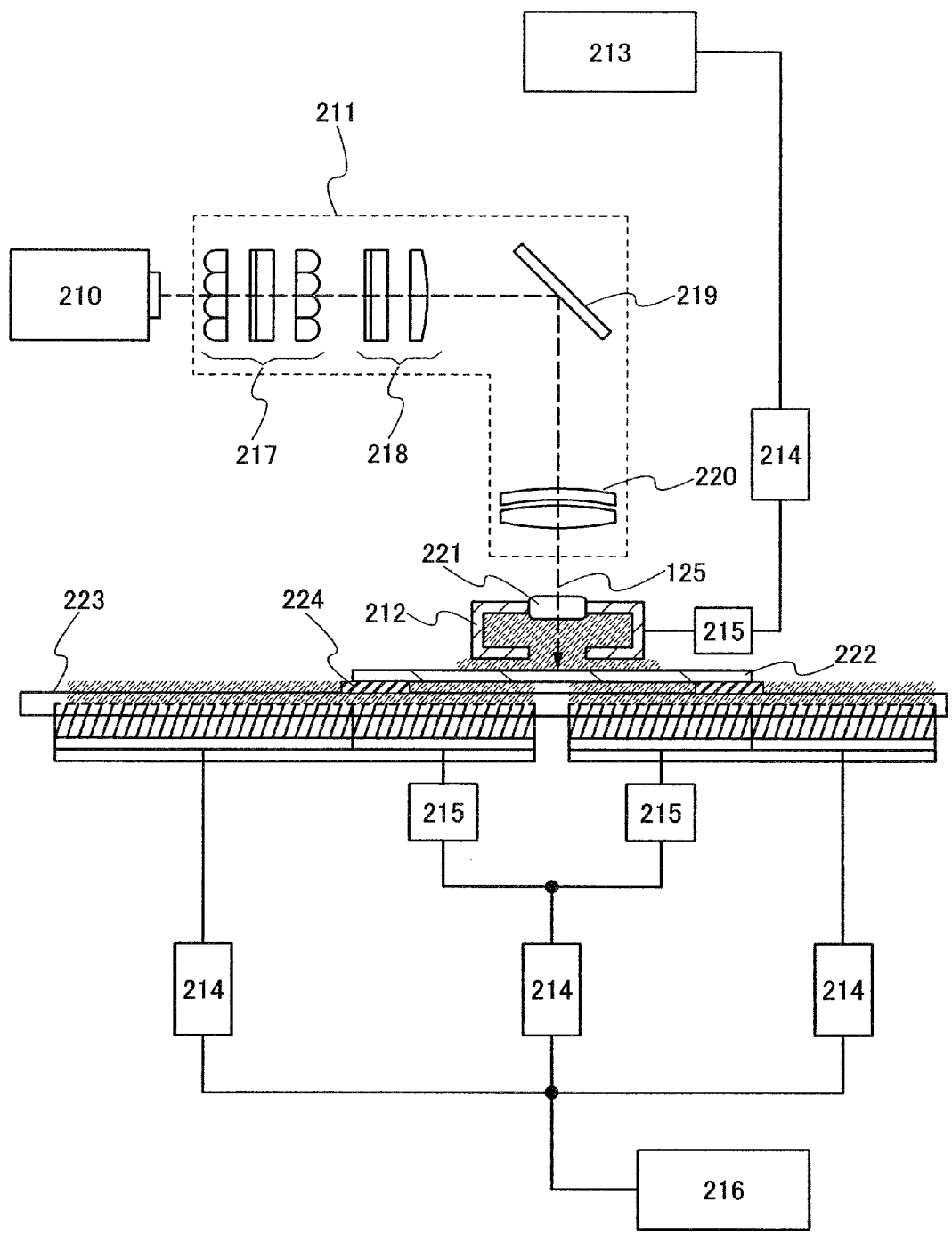
FIG. 11 is a schematic view showing a structure of a laser processing apparatus.

An example of a laser treatment apparatus for this laser treatment will be described with reference to FIG. 11. The laser treatment apparatus is provided with a laser 210, an optical system 211 which condenses and extends laser light into a thin linear beam, a gas jetting pipe 212 which controls the atmosphere of a region to be irradiated with a laser, a gas supply portion 213 which supplies a gas for controlling the atmosphere to the gas jetting pipe 212, a flow rate control portion 214, a gas heating portion 215, a substrate stage 222 which floats and carries the supporting substrate 101, a guide rail 223 which carries the substrate while supporting both ends of the substrate, and a gas supply portion 216 which supplies a gas for floating to the substrate stage 222.

As the laser 210, a laser which emits light with a wavelength in a range from ultraviolet to visible light is selected. The laser 210 preferably is a pulsed ArF, KrF, or XeCl excimer laser, or a solid-state laser such as an Nd—YAG laser or YLF laser, with a repetition rate of 1 MHz or less and a pulse width which is equal to or greater than 10 ns and equal to or less than 500 ns. As the laser, a XeCl excimer laser with a repetition rate of 10 to 300 Hz, a pulse width of 25 ns, and a wavelength of 308 nm can be used, for example.

The optical system 211 condenses and extends laser light to form a laser beam a cross-section portion of which has a linear shape on a surface to be irradiated. The optical system 211 which forms a linear beam includes a cylindrical lens array 217, a cylindrical lens 218, a mirror 219, and a doublet cylindrical lens 220. The linear laser light of about 100 to 700 mm in a longer direction and about 100 to 500 μm in a shorter direction can be emitted, though it depends on the size of the lens.

The supporting substrate 101 is irradiated with the laser beam condensed into a linear shape through a light introduce window 221 of the gas jetting pipe 212. The gas jetting pipe 212 is provided in vicinity to the supporting substrate 101. A nitrogen gas is supplied to the gas jetting pipe 212 from the gas supply portion 213. The nitrogen gas is jetted from an opening portion of the gas jetting pipe 212, which faces the supporting substrate 101. The opening portion of the gas jetting pipe 212 is provided in accordance with an optical axis of the linear laser beam so that the supporting substrate 101 is irradiated with the laser beam which enters through the light introduce window 221. Due to the nitrogen gas jetted from the opening portion of the gas jetting pipe 212, a region to be irradiated with the laser beam comes to have a nitrogen atmosphere.

The temperature of a surface of the supporting substrate 101, which is to be irradiated with the laser beam, can be controlled with the nitrogen gas which is supplied to the gas jetting pipe 212 and heated up to 250° C. to 600° C. in the gas heating portion 215. By heating the region to be irradiated in advance, melting time due to the laser beam irradiation can be controlled as described above.

Air or nitrogen is supplied to the substrate stage 222 from the gas supply portion 216 through the flow rate control portion 214. A gas supplied from the gas supply portion 216 is jetted so that a bottom surface of the supporting substrate 101 is sprayed with the gas from a top surface of a substrate stage 222; in this manner, the supporting substrate 101 is floated. The supporting substrate 101 is carried with its both ends mounted on a slider 224 which moves on the guide rail 223. Since the supporting substrate 101 is sprayed with a gas from the substrate stage 222 side, the supporting substrate 101 can be carried without being curved while it is floated. In the laser treatment apparatus of this embodiment mode, a nitrogen gas is jetted from the gas jetting pipe 212 to the top surface of the supporting substrate 101, and therefore, the supporting substrate 101 can be prevented from being bent by spraying of a gas also from a back surface of the supporting substrate 101.

The substrate stage 222 can be divided into a region including a laser irradiation portion and the vicinity thereof, and the other region. The laser irradiation portion vicinity of the substrate stage 222 can be sprayed with a nitrogen gas heated by the gas heating portion 215, so that the supporting substrate 105 can be heated.

The laser treatment shown in FIG. 9 is effective in terms of repairing defects of the single crystal semiconductor layer 106. That is, in a photoelectric conversion device, carriers (electrons and holes) generated in a semiconductor by photoelectric conversion are collected as current in an electrode formed over a surface of a semiconductor layer. At this time, if the number of recombination centers at the surface of the semiconductor layer is large, photogenerated carriers are quenched there, which becomes a cause of deteriorating photoelectric conversion characteristic. Thus, repairing defects of the single crystal semiconductor layer by laser treatment is effective.

Embodiment Mode 4

Figure 12A:
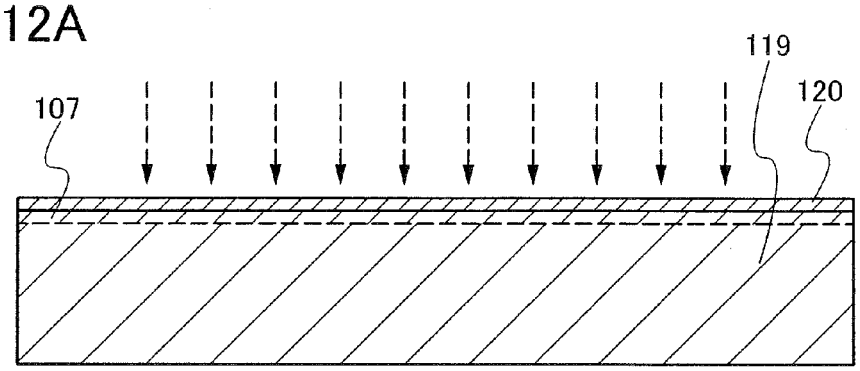
FIGS. 12A to 12C are cross-sectional views for describing a process for manufacturing the stacked photoelectric conversion device.
Figure 12B:
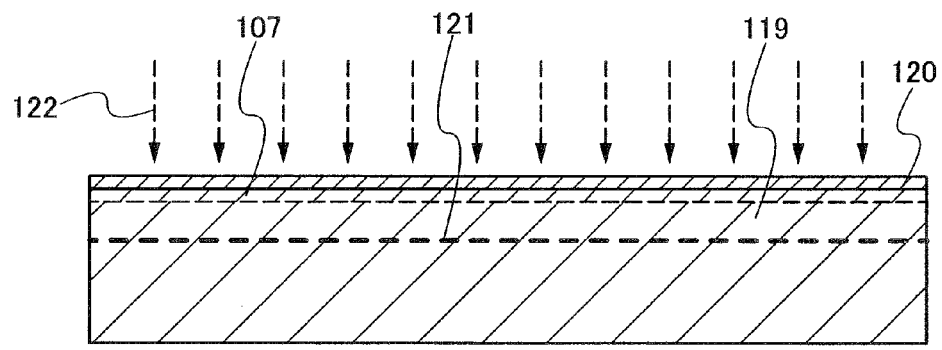
Figure 12C:
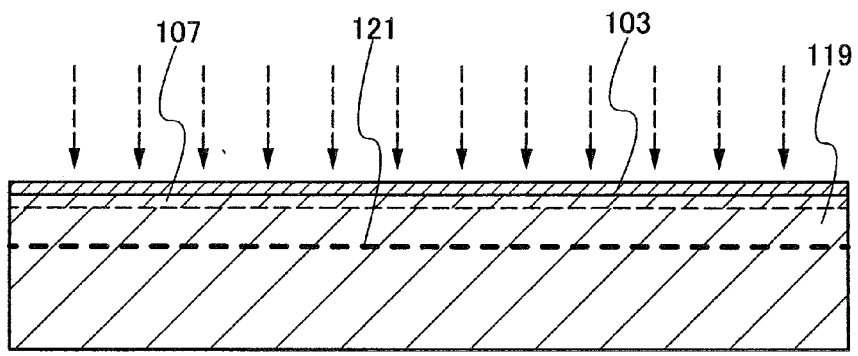

In this embodiment mode, manufacturing steps which are different from those in Embodiment Mode 1 will be described with reference to FIGS. 12A to 12C. The protection film 120 and the first impurity semiconductor layer 107 are formed (FIG. 12A), and then, the damaged layer 121 may be formed with the protection film 120 left (FIG. 12B). After that, the protection film 120 is removed and the first electrode 103 is formed (FIG. 12C). Such steps make it possible to effectively use the protection film 120. That is, the protection film 120 damaged due to the irradiation with ions is removed before the first electrode 103 is formed, so that the surface of the semiconductor substrate 119 can be prevented from being damaged. In addition, since the damaged layer 121 into which cluster ions of hydrogen are introduced is formed through the first impurity semiconductor layer 107, hydrogenation of the first impurity semiconductor layer 107 can also be performed. Subsequent steps may be performed in a similar manner to Embodiment Mode 1.

Embodiment Mode 5

Figure 13A:
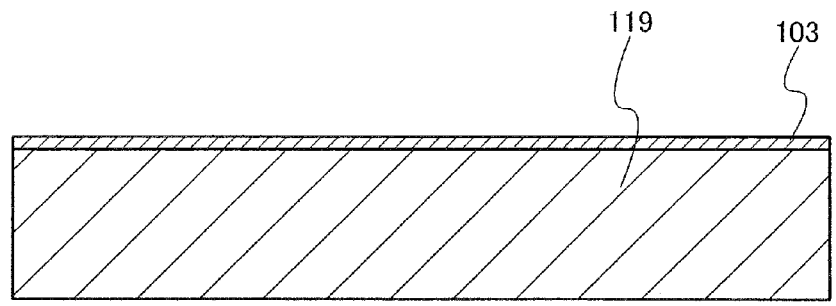
FIGS. 13A to 13C are cross-sectional views for describing a process for manufacturing the stacked photoelectric conversion device.
Figure 13B:
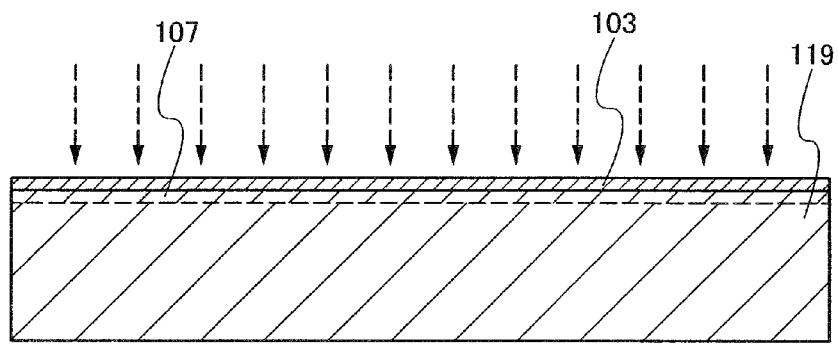
Figure 13C:
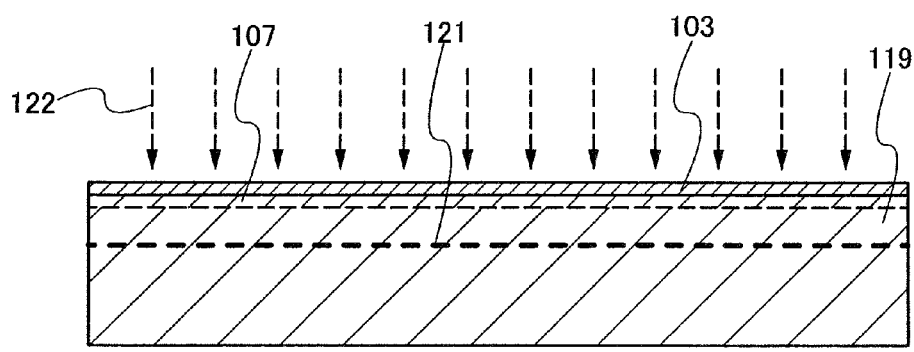

In this embodiment mode, manufacturing steps which are different from those in Embodiment Mode 1 will be described with reference to FIGS. 13A to 13C. The first electrode 103 is formed over the semiconductor substrate 119 (FIG. 13A), and an impurity which imparts one conductivity type is added through the first electrode 103 to form the first impurity semiconductor layer 107 (FIG. 13B). Then, cluster ions of hydrogen are introduced through the first electrode 103 to form the damaged layer 121 (FIG. 13C). In this process, the first electrode 103, which is formed first, can be used as a layer against damage due to ion doping. In addition, a step of forming a protection film for ion doping can be omitted. Subsequent steps may be performed in a similar manner to Embodiment Mode 1.

Embodiment Mode 6

Figure 14A:
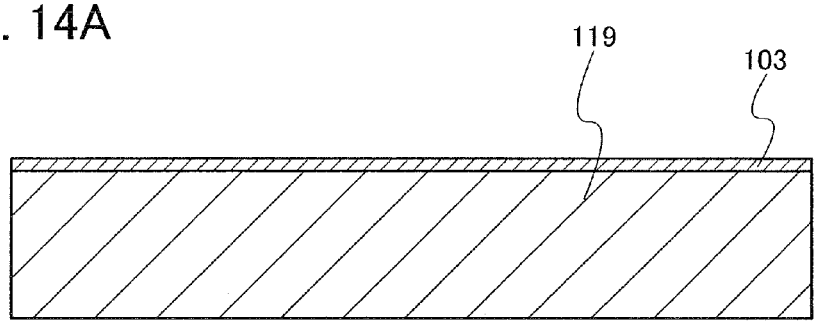
FIGS. 14A to 14C are cross-sectional views for describing a process for manufacturing the stacked photoelectric conversion device.
Figure 14B:
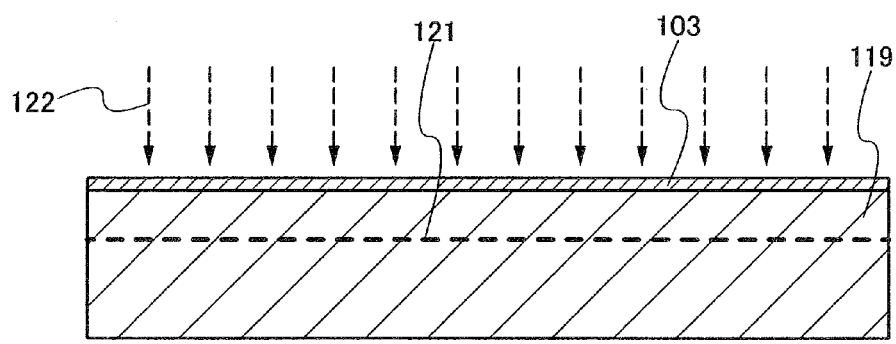
Figure 14C:
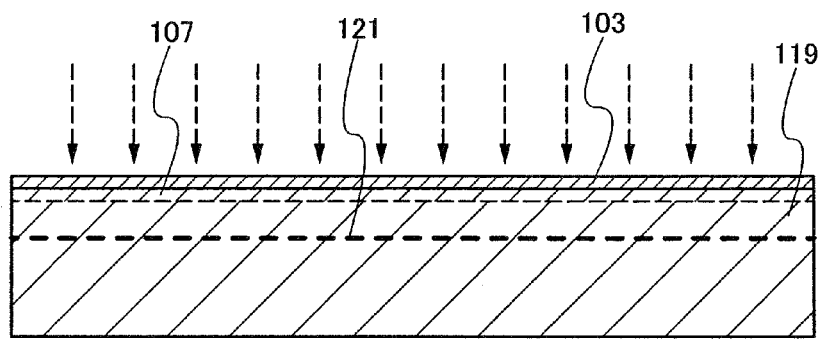

In this embodiment mode, manufacturing steps which are different from those in Embodiment Mode 1 will be described with reference to FIGS. 14A to 14C. The first electrode 103 is formed over the semiconductor substrate 119 (FIG. 14A), and cluster ions of hydrogen are introduced through the first electrode 103 to form the damaged layer 121 (FIG. 14B). Then, an impurity which imparts one conductivity type is added through the first electrode 103 to form the first impurity semiconductor layer 107 (FIG. 14C). In this process, the first electrode 103, which is formed first, can be used as a layer against damage due to ion doping. In this embodiment mode, a step of forming a protection film for ion doping can be omitted. Subsequent steps may be performed in a similar manner to Embodiment Mode 1.

Embodiment Mode 7

Figure 15A:
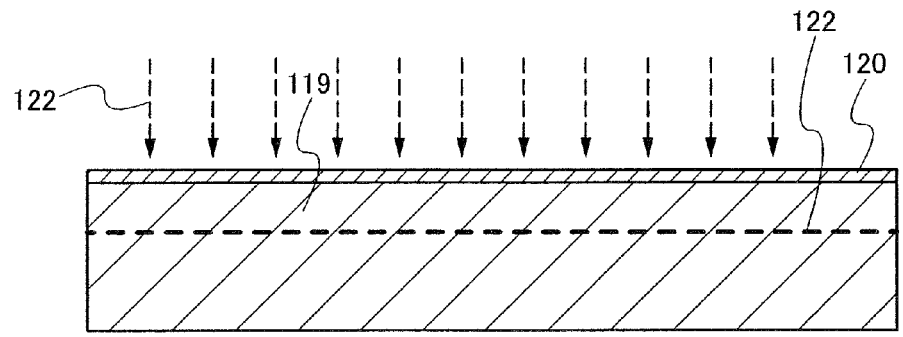
FIGS. 15A to 15C are cross-sectional views for describing a process for manufacturing the stacked photoelectric conversion device.
Figure 15B:
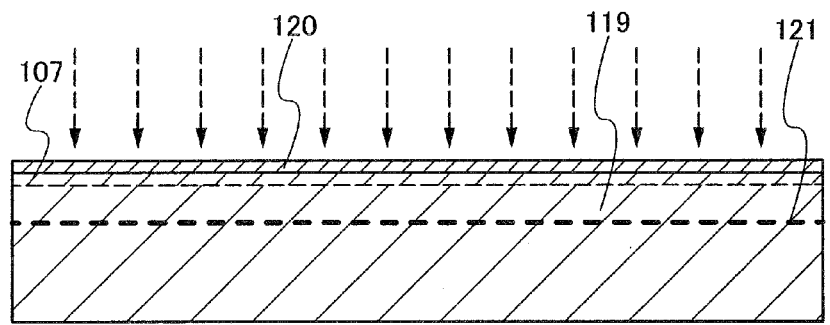
Figure 15C:
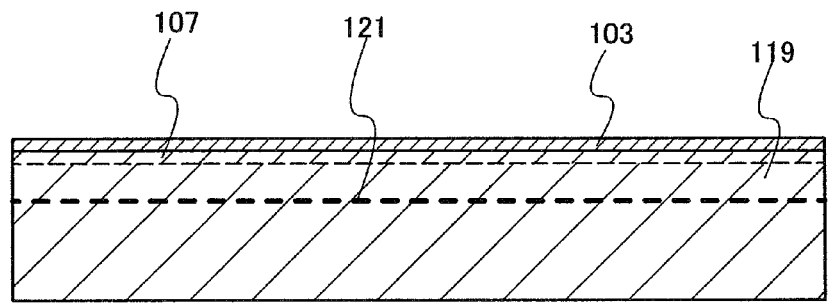

In this embodiment mode, manufacturing steps which are different from those in Embodiment Mode 1 will be described with reference to FIGS. 15A to 15C. The protection film 120 is formed, and cluster ions of hydrogen are introduced to form the damaged layer 121 (FIG. 15A), and the first impurity semiconductor layer 107 is formed with the protection film 120 left (FIG. 15B). Then, the protection film 120 is removed and the first electrode 103 is formed (FIG. 15C). Such steps make it possible to effectively use the protection film 120. In addition, since the first impurity semiconductor layer 107 is formed after the damaged layer 121 is formed, the impurity concentration of the first impurity semiconductor layer 107 can be increased and a shallow junction can be formed. Accordingly, a photoelectric conversion device which has high collection efficiency of photogenerated carriers by back surface field (BSF) effect can be manufactured. Subsequent steps may be performed in a similar manner to Embodiment Mode 1.

Embodiment Mode 8

Figure 16A:
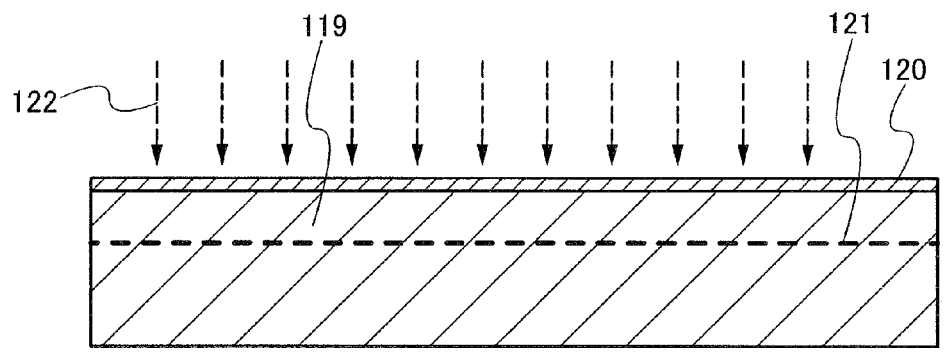
FIGS. 16A to 16C are cross-sectional views for describing a process for manufacturing the stacked photoelectric conversion device.
Figure 16B:
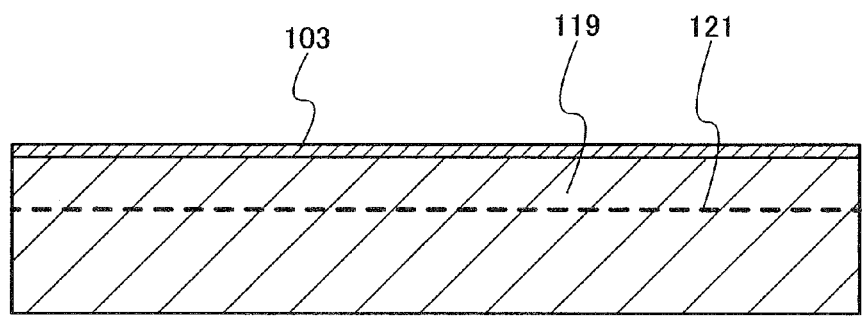
Figure 16C:
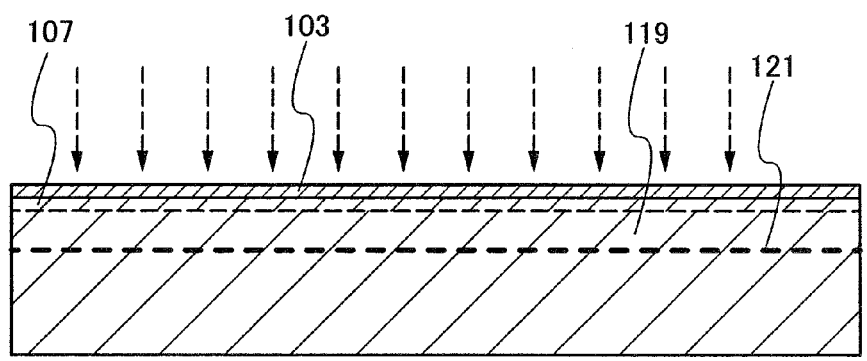

In this embodiment mode, manufacturing steps which are different from those in Embodiment Mode 1 will be described with reference to FIGS. 16A to 16C. The protection film 120 is formed, and cluster ions of hydrogen are introduced to form the damaged layer 121 (FIG. 16A), and the protection film 120 is removed and the first electrode 103 is formed (FIG. 16B). Then, an impurity which imparts one conductivity type is added through the first electrode 103 to form the first impurity semiconductor layer 107 (FIG. 16C). Since the first impurity semiconductor layer 107 is formed through the first electrode 103, the thickness of the first impurity semiconductor layer 107 can be easily controlled. Subsequent steps may be performed in a similar manner to Embodiment Mode 1.

Embodiment Mode 9

Figure 17A:
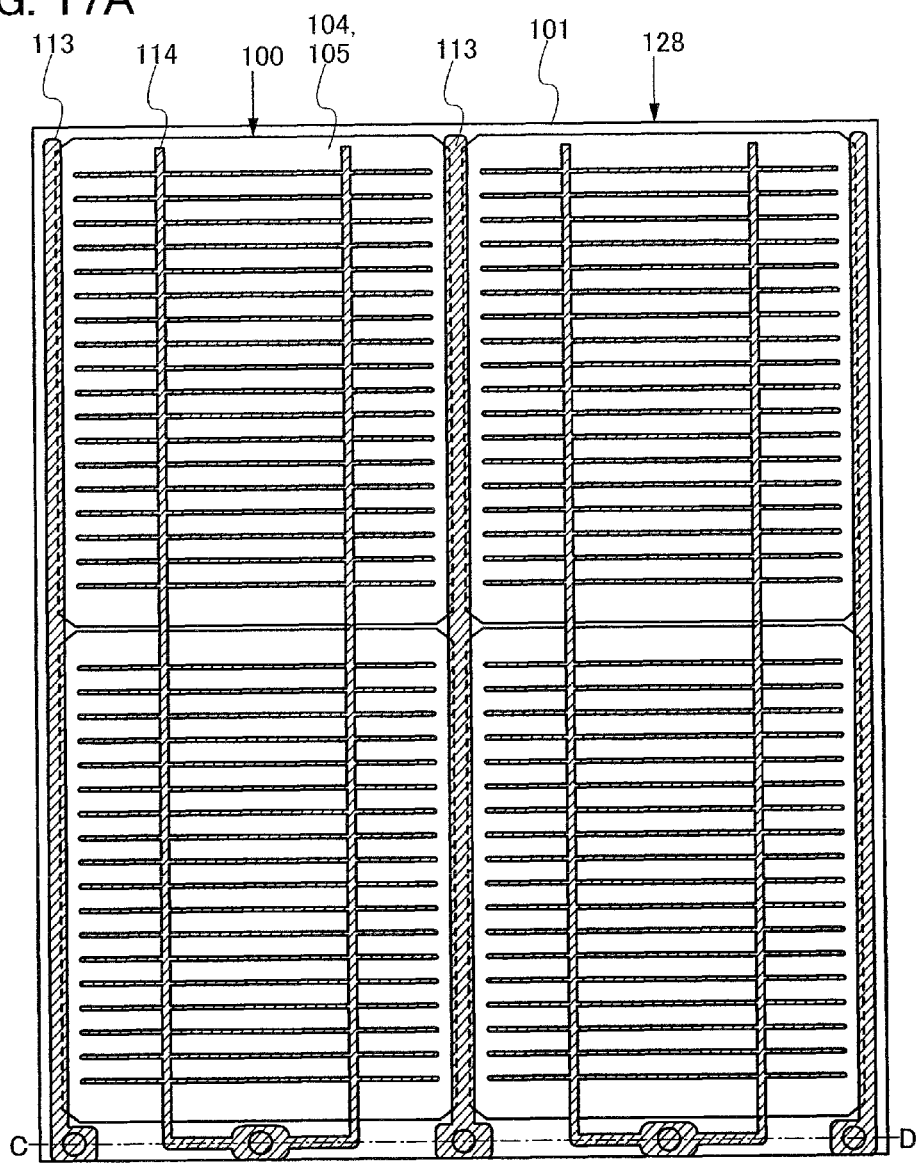
FIG. 17A is a plan view showing a structure of a solar photovoltaic module.

An example of a solar photovoltaic module using any photoelectric conversion device manufactured according to Embodiment Modes 1 to 8 is shown in FIG. 17A. This solar photovoltaic module 128 includes the first unit cell 104 and the second unit cell 105 provided over the supporting substrate 101.

Figure 17B:
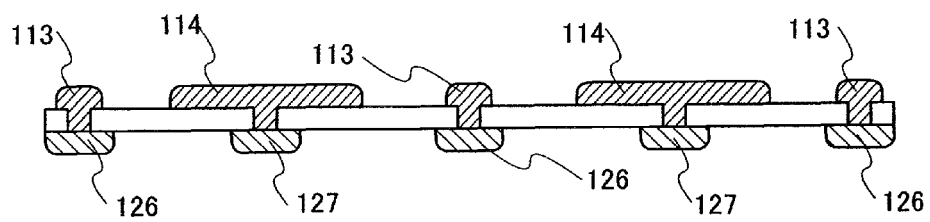
FIG. 17B is a cross-sectional view taken along section line C-D of FIG. 17A.

The first auxiliary electrode 113 and the second auxiliary electrode 114 are formed over one surface of the supporting substrate 101, and connected to a first rear electrode 126 and a second rear electrode 127 each for connector, respectively at end regions of the supporting substrate 101. FIG. 17B is a cross-sectional view taken along section line C-D of FIG. 17A. The first auxiliary electrode 113 is connected to the first rear electrode 126 and the second auxiliary electrode 114 is connected to the second rear electrode 127 through pass-through openings of the supporting substrate 101.

The photoelectric conversion device 100 is manufactured in which the first supporting substrate 101 is provided with the first unit cell 104 and the second unit cell 105 as described above, whereby reduction in thickness of the solar photovoltaic module 128 can be achieved.

Embodiment Mode 10

Figure 18:
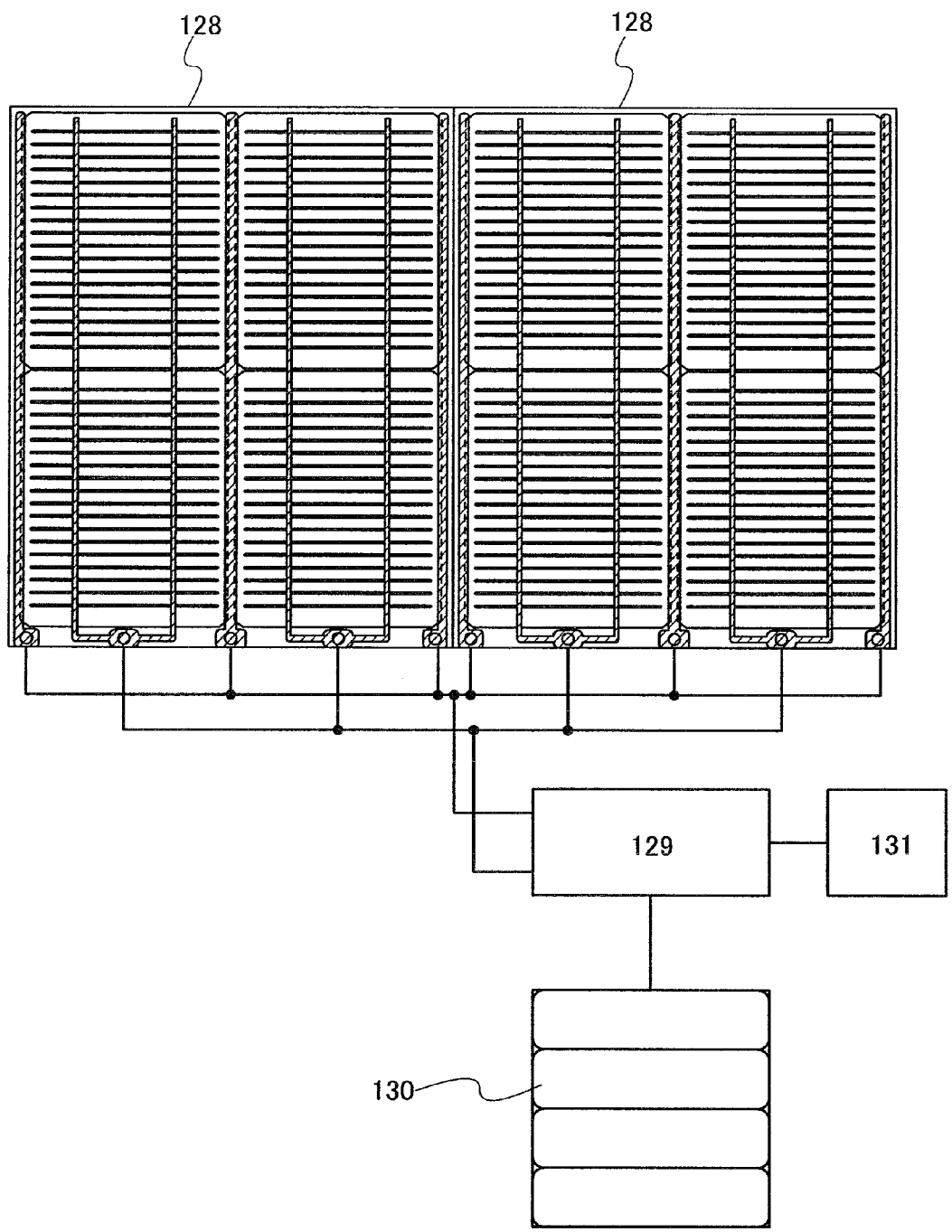
FIG. 18 is a view showing an example of a solar photovoltaic system.

FIG. 18 shows an example of a solar photovoltaic system using the solar photovoltaic module 128. Output power of one or a plurality of solar photovoltaic modules 128 charges a rechargeable battery 130 with a charge control circuit 129. In the case where the charged amount of the rechargeable battery 130 is large, the output power is directly outputted to a load 131 in some cases.

When an electric double layer capacitor is used for the rechargeable battery 130, a chemical reaction is not needed for charging and the battery can be charged rapidly and the lifetime of the rechargeable battery 130 can be increased by about 8 times and the charge-discharge efficiency thereof can be increased by 1.5 times in comparison with a lead battery or the like which uses a chemical reaction. The load 131 can be used for various purposes such as lighting such as a fluorescent lamp, a light-emitting diode, or an electroluminescent panel, and a small-size electronic device.

This application is based on Japanese Patent Application serial No. 2007-292650 filed with Japan Patent Office on Nov. 9, 2007, the entire contents of which are hereby incorporated by reference.

The invention claimed is:

1. A method for manufacturing a photoelectric conversion device, comprising:
forming a first impurity semiconductor layer on a side of one surface of a single crystal semiconductor substrate;
forming a first electrode over the first impurity semiconductor layer;
introducing a cluster ion into the single crystal semiconductor substrate through the first electrode and the first impurity semiconductor layer to form a damaged layer;
forming an insulating layer over the first electrode;
bonding the insulating layer to a supporting substrate;
cleaving the single crystal semiconductor substrate at the damaged layer, so that a single crystal semiconductor layer remains over the supporting substrate;
forming a second impurity semiconductor layer on a cleavage plane side of the single crystal semiconductor layer;
forming a third impurity semiconductor layer over the second impurity semiconductor layer;
forming a non-single-crystal semiconductor layer over the third impurity semiconductor layer;
forming a fourth impurity semiconductor layer over the non-single-crystal semiconductor layer; and forming a second electrode over the fourth impurity semiconductor layer.

2. The method according to claim 1 further comprising:
forming a protection film over the single crystal semiconductor substrate before forming the first impurity semiconductor layer.

3. The method according to claim 1,
wherein the cluster ion is introduced by irradiating the single crystal semiconductor substrate with an ion beam containing, at at least 50%, the cluster ion which is a hydrogen ion and larger in mass than a hydrogen molecule.

4. The method according to claim 1,
wherein the first impurity semiconductor layer and the third impurity semiconductor layer have one conductivity type, and
wherein the second impurity semiconductor layer and the fourth impurity semiconductor layer have an opposite conductivity type to the one conductivity type.

5. The method according to claim 1,
wherein the non-single-crystal semiconductor layer is formed by decomposing a reactive gas including a semiconductor source gas with an electromagnetic energy.

6. The method according to claim 1, wherein the cluster ion is $H_3^+$.

7. The method according to claim 1,
wherein the insulating layer is formed over the first electrode after the step of introducing the cluster ion.

8. A method for manufacturing a photoelectric conversion device, comprising:
forming a protection film over a side of one surface of a single crystal semiconductor substrate;
forming a first impurity semiconductor layer on the side of one surface of the single crystal semiconductor substrate by adding an impurity through the protection film;
removing the protection film;
forming a first electrode over the first impurity semiconductor layer;
introducing a cluster ion into the single crystal semiconductor substrate from the one surface to form a damaged layer through the first electrode and the first impurity semiconductor layer;
forming an insulating layer over the first electrode;
bonding the insulating layer to a supporting substrate;
cleaving the single crystal semiconductor substrate at the damaged layer, so that a single crystal semiconductor layer remains over the supporting substrate;
forming a second impurity semiconductor layer on a cleavage plane side of the single crystal semiconductor layer;
forming a third impurity semiconductor layer over the second impurity semiconductor layer;
forming a non-single-crystal semiconductor layer over the third impurity semiconductor layer;
forming a fourth impurity semiconductor layer over the non-single-crystal semiconductor layer; and
forming a second electrode over the fourth impurity semiconductor layer.

9. The method according to claim 8,
wherein the cluster ion is introduced by irradiating the single crystal semiconductor substrate with an ion beam containing, at at least 50%, the cluster ion which is a hydrogen ion and larger in mass than a hydrogen molecule.

10. The method according to claim 8,
wherein the first impurity semiconductor layer and the third impurity semiconductor layer have one conductivity type, and
wherein the second impurity semiconductor layer and the fourth impurity semiconductor layer have an opposite conductivity type to the one conductivity type.

11. The method according to claim 8,
wherein the non-single-crystal semiconductor layer is formed by decomposing a reactive gas including a semiconductor source gas with an electromagnetic energy.

12. The method according to claim 8, wherein the cluster ion is $H_3^+$.

13. The method according to claim 8, wherein the protection film is formed of silicon oxide or silicon nitride.

* * * * *